(12) United States Patent
Yokota et al.

(10) Patent No.: US 6,678,203 B1
(45) Date of Patent: Jan. 13, 2004

(54) EDITING APPARATUS, EDITING METHOD, AND NON-VOLATILE MEMORY

(75) Inventors: Teppei Yokota, Chiba (JP); Nobuyuki Kihara, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/103,515

(22) Filed: Mar. 21, 2002

Related U.S. Application Data

(62) Division of application No. 09/645,751, filed on Aug. 24, 2000, now Pat. No. 6,580,647.

(30) Foreign Application Priority Data

Aug. 27, 1999 (JP) .......................................... P11-241252

(51) Int. Cl.⁷ .............................................. G11C 8/00
(52) U.S. Cl. ............................. 365/230.03; 365/185.11
(58) Field of Search ...................... 365/230.03, 185.11, 365/185.33

(56) References Cited

U.S. PATENT DOCUMENTS

| | | | | |
|---|---|---|---|---|
| 5,734,816 A | * | 3/1998 | Niijima et al. | .................. 714/8 |
| 6,212,097 B1 | * | 4/2001 | Kihara et al. | .......... 365/185.04 |
| 6,385,690 B1 | * | 5/2002 | Iida et al. | .................... 711/103 |
| 6,407,972 B1 | * | 6/2002 | Koyata et al. | ................ 369/83 |

* cited by examiner

Primary Examiner—Richard Elms
Assistant Examiner—Tuan T. Nguyen
(74) Attorney, Agent, or Firm—Frommer Lawrence & Haug LLP; William S. Frommer

(57) ABSTRACT

An editing apparatus for editing a digest portion of a program recorded on a non-volatile memory is disclosed, that having an input device for allowing the user to input a start position and an end position of the digest portion, a generating device for generating a start address and digest period information of the digest portion corresponding to the start address and the end position, and a recording device for recording the start address and the digest period information of the digest portion to the non-volatile memory.

2 Claims, 23 Drawing Sheets

FILE SYSTEM PROCESS HIERARCHY

Fig. 11

REPRODUCTION MANAGEMENT FILE (PBLIST)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0X0000 | BLKID-TL0 | | | | Reserved | | MCode | | REVISION | | | | | Reserved | | |
| 0X0010 | SN1C+L | | SN2C+L | | SINFSIZE | | T-TRK | VerNo | | | | Reserved | | | | |
| 0X0020 | NM1-S(256) | | | | | | | | | | | | | | | |
| 0X0120 | NM2-S(512) | | | | | | | | | | | | | | | |
| 0X0320 | Reserved | | | | | | | | | | CONTENTSKEY | | | | | |
| 0X0330 | Reserved | | | | | | | | | | MAC | | | | | |
| | Reserved | | | | | | | | | | | | S-YMDhms | | | |
| 0X0350 | TRK-001 | TRK-002 | | TRK-003 | TRK-004 | | TRK-005 | | | TRK-006 | | TRK-007 | TRK-008 | | | |
| | TRK-009 | TRK-010 | | TRK-011 | TRK-012 | | TRK-013 | | | TRK-014 | | TRK-015 | TRK-016 | | | |
| 0X0660 | TRK-393 | TRK-394 | | TRK-395 | TRK-396 | | TRK-397 | | | TRK-398 | | TRK-399 | TRK-400 | | | |
| 0X0647 | INF-S(14720) | | | | | | | | | | | | | | | |
| 0X3FF0 | BLKID-TL0 | | | | Reserved | | MCode | | REVISION | | | | | Reserved | | |

TRKTBL: rows from 0X0350 to 0X0660

Fig. 12A

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0X0000 | BLKID-TL0 | | | | Reserved | | MCode | | REVISION | | | | Reserved | | | |
| 0X0010 | SN1C+L | | SN2C+L | | SINFSIZE | | T-TRK | | VerNo | | Reserved | | | | | |
| 0X0020 | NM1-S(256) | | | | | | | | | | | | | | | |
| 0X0120 | NM2-S(512) | | | | | | | | | | | | | | | |
| 0X0320 | Reserved | | | | | | | | | | CONTENTSKEY | | | | | |
| 0X0330 | Reserved | | | | | | | | | | MAC | | | | | |
| | | | | | | Reserved | | | | | | | S-YMDhms | | | |
| 0X0350 | TRK-001 | | TRK-002 | | TRK-003 | | TRK-004 | | TRK-005 | | TRK-006 | | TRK-007 | | TRK-008 | |
| 0X0360 | TRK-009 | | TRK-010 | | TRK-011 | | TRK-012 | | TRK-013 | | TRK-014 | | TRK-015 | | TRK-016 | |
| 0X0660 | TRK-393 | | TRK-394 | | TRK-395 | | TRK-396 | | TRK-397 | | TRK-398 | | TRK-399 | | TRK-400 | |
| 0X0670 | INF-S(14720) | | | | | | | | | | | | | | | |
| 0X3FF0 | BLKID-TL0 | | | | Reserved | | MCode | | REVISION | | | | Reserved | | | |

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| | INF | 0x00 | ID | 0x00 | SIZE | | MCode | | C+L | | Reserved | | DATA VARIABLE LENGTH | | | |

Fig. 13

| ID | MUSIC INFORMATION (CHARACTERS) | | ID | URL INFORMATION (WEB INFORMATION) | |
|---|---|---|---|---|---|
| 0 | RESERVED | | 32 | RESERVED | |
| 1 | ALBUM | VARIABLE | 33 | ALBUM | VARIABLE |
| 2 | SUBTITLE | VARIABLE | 34 | SUB TITLE | VARIABLE |
| 3 | ARTIST | VARIABLE | 35 | ARTIST | VARIABLE |
| 4 | CONDUCTOR | VARIABLE | 36 | CONDUCTOR | VARIABLE |
| 5 | ORCHESTRA | VARIABLE | 37 | ORCHESTRA | VARIABLE |
| 6 | PRODUCER | VARIABLE | 38 | PRODUCER | VARIABLE |
| 7 | PUBLISHER | VARIABLE | 39 | PUBLISHER | VARIABLE |
| 8 | COMPOSER | VARIABLE | 40 | COMPOSER | VARIABLE |
| 9 | SONG WRITER | VARIABLE | 41 | SONG WRITER | VARIABLE |
| 10 | ARRANGER | VARIABLE | 42 | ARRANGER | VARIABLE |
| 11 | SPONSOR | VARIABLE | 43 | SPONSOR | VARIABLE |
| 12 | CM | VARIABLE | 44 | CM | VARIABLE |
| 13 | GUIDE | VARIABLE | 45 | GUIDE | VARIABLE |
| 14 | ORIGINAL MUSIC PROGRAM TITLE | VARIABLE | 46 | ORIGINAL MUSIC PROGRAM TITLE | VARIABLE |
| 15 | ORIGINAL ALBUM TITLE | VARIABLE | 47 | ORIGINAL ALBUM TITLE | VARIABLE |
| 16 | ORIGINAL MUSIC PROGRAM COMPOSER | VARIABLE | 48 | ORIGINAL MUSIC PROGRAM COMPOSER | VARIABLE |
| 17 | ORIGINAL MUSIC PROGRAM SONG WRITER | VARIABLE | 49 | ORIGINAL MUSIC PROGRAM SONG WRITER | VARIABLE |
| 18 | ORIGINAL MUSIC PROGRAM ARRANGER | VARIABLE | 50 | ORIGINAL MUSIC PROGRAM ARRANGER | VARIABLE |
| 19 | ORIGINAL MUSIC PROGRAM PERFORMER | VARIABLE | 51 | ORIGINAL MUSIC PROGRAM PERFORMER | VARIABLE |
| 20 | MESSAGE | VARIABLE | 52 | | |
| 21 | COMMENT | VARIABLE | 53 | | |
| 22 | WARNING | VARIABLE | 54 | | |
| 23 | GENRE | VARIABLE | 55 | | |
| 24 | | | 56 | | |
| 25 | | | 57 | | |
| 26 | | | 58 | | |
| 27 | | | 59 | | |
| 28 | | | 60 | | |
| 29 | | | 61 | | |
| 30 | | | 62 | | |
| 31 | | | 63 | | |

Fig. 14

| ID | PATH/OTHERS | | ID | CONTROL/NUMERIC DATA INFORMATION | |
|---|---|---|---|---|---|
| 64 | RESERVED | | 96 | RESERVED | |
| 65 | PATH TO VIDEO DATA | VARIABLE | 97 | ISRC | 8 |
| 66 | PATH TO SONG DATA | VARIABLE | 98 | TOC_ID | 8 |
| 67 | PATH TO MIDI DATA | VARIABLE | 99 | UPC/JAN | 7 |
| 68 | PATH TO GUIDE DATA | VARIABLE | 100 | RECORDED DATE (YMDhms) | 4 |
| 69 | PATH TO COMMENT DATA | VARIABLE | 101 | RELEASED DATE | 4 |
| 70 | PATH TO CM DATA | VARIABLE | 102 | ORIGINAL MUSIC PROGRAM RELEASED DATE (YMDhms) | 4 |
| 71 | PATH TO FAX DATA | VARIABLE | 103 | RECORDED DATE (YMDhms) | 4 |
| 72 | PATH TO COMMUNICATION DATA 1 | VARIABLE | 104 | SUB TRACK | 4 |
| 73 | PATH TO COMMUNICATION DATA 2 | VARIABLE | 105 | AVERAGE VOLUME LEVEL | 1 |
| 74 | PATH TO CONTROL DATA | VARIABLE | 106 | RESUME | 4 |
| 75 | | | 107 | REPRODUCTION LOG (YMDhms) | 4 |
| 76 | | | 108 | NUMBER OF REPRODUCTION TIMES (FOR LEARNING) | 1 |
| 77 | ALBUM DIGEST | VARIABLE | 109 | PASSWORD 1 | 16 |
| 78 | | | 110 | APPLevel | 16 |
| 79 | | | 111 | GENRE CODE | 1 |
| 80 | | | 112 | MIDI DATA | |
| 81 | | | 113 | THUMB NAIL PHOTOGRAPH DATA | |
| 82 | | | 114 | TEXT MULTIPLEXED BROADCAST DATA | |
| 83 | | | 115 | NUMBER OF TOTAL MUSIC PROGRAMS | |
| 84 | | | 116 | SET NUMBER | |
| 85 | | | 117 | NUMBER OF TOTAL SETS | |
| 86 | | | 118 | REC POSITION INFORMATION - GPS | VARIABLE |
| 87 | | | 119 | PB POSITION INFORMATION - GPS | VARIABLE |
| 88 | | | 120 | REC POSITION INFORMATION - PHS | VARIABLE |
| 89 | | | 121 | PB POSITION INFORMATION - PHS | VARIABLE |
| 90 | | | 122 | CONNECTION DESTINATION TELEPHONE NUMBER 1 | VARIABLE |
| 91 | | | 123 | CONNECTION DESTINATION TELEPHONE NUMBER 2 | VARIABLE |
| 92 | | | 124 | INPUT VALUE | VARIABLE |
| 93 | | | 125 | OUTPUT VALUE | VARIABLE |
| 94 | | | 126 | PB CONTROL DATA | VARIABLE |
| 95 | | | 127 | REC CONTROL DATA | VARIABLE |

Fig. 15

| ID | SYNCHRONOUS REPRODUCTION INFORMATION | |
|---|---|---|
| 128 | RESERVED | |
| 129 | SYNCHRONOUS REPRODUCTION INFORMATION 1 | VARIABLE |
| 130 | SYNCHRONOUS REPRODUCTION INFORMATION 2 | VARIABLE |
| 131 | SYNCHRONOUS REPRODUCTION INFORMATION 3 | VARIABLE |
| 132 | SYNCHRONOUS REPRODUCTION INFORMATION 4 | VARIABLE |
| 133 | SYNCHRONOUS REPRODUCTION INFORMATION 5 | VARIABLE |
| 134 | SYNCHRONOUS REPRODUCTION INFORMATION 6 | VARIABLE |
| 135 | | |
| 136 | | |
| 137 | | |
| 138 | EMD INFORMATION 1 | VARIABLE |
| 139 | EMD INFORMATION 2 | VARIABLE |
| 140 | | |
| 141 | | |
| 142 | | |
| 143 | | |
| 144 | | |
| 145 | | |
| 146 | | |
| 147 | | |
| 148 | | |
| 149 | | |
| 150 | | |
| 151 | | |
| 152 | | |
| 153 | | |
| 154 | | |
| 155 | | |
| 156 | | |
| 157 | | |
| 158 | | |
| 159 | | |

Fig. 17

A3Dnnnnn.MSA(ATRAC3 DATA FILE)

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0x0000 | BLKID-HD0 ||||  Reserved || MCode || Reseved |||| BLOCK SERIAL ||||
| 0x0010 | N1C+L || N2C+L || INFSIZE || T-PRT || T-SU |||| INX || XT ||
| 0x0020 | NM1(256) |||||||||||||||||
| 0x0120 | NM2(512) |||||||||||||||||
| 0x0310 | |||||||||||||||||
| 0x0320 | Reserved(8) |||||||| CONTENTSKEY ||||||||
| | Reserved(8) |||||||| MAC ||||||||
| | Reserved(12) |||||||||||| A | LT || FNo ||
| | MG(D)SERIAL-nnn ||||||||||||||||
| 0x0360 | CONNUM |||| YMDhms-S |||| YMDhms-E |||| MT | CT | CC | CN |
| 0x0370 | PRTSIZE |||| PRTKEY |||||| Reserved(8) ||||||
| 0x0380 | | | | CONNUM0 ||||| PRTSIZE(0x0388) ||||| PRTKEY |||
| 0x0390 | Reserved(8) |||||||||||| CONNUM0 ||||
| | INF(0x0400) |||||||||||||||||
| 0x3FFF | BLKID-HD0 |||| Reserved || MCode || Reseved |||| BLOCK SERIAL ||||
| 0x4000 | BLKID-A3D |||| Reserved || MCode || CONNUM0 |||| BLOCK SERIAL ||||
| 0x4010 | BLOCK SEED |||||||| INITIALIZATION VECTOR ||||||||
| 0x4020 | SU-000(Nbyte=384byte) ||||||||||||||||
| 0x41A0 | SU-001(Nbyte) ||||||||||||||||
| 0x4320 | SU-002(Nbyte) ||||||||||||||||
| 0x04A0 | SU-041(Nbyte) ||||||||||||||||
| 0x7DA0 | |||||||||||||||||
| 0x7F20 | Reserved(Nbyte=208byte) ||||||||||||||||
| | BLOCK SEED |||||||||||||| | | |
| 0x7FF0 | BLKID-A3D |||| Reserved || MCode || CONNUM0 |||| BLOCK SERIAL ||||

Fig. 18

|  | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0x0000 | BLKID-HD0 | | | | Reserved | | MCode | | Reseved | | | | BLOCK SERIAL | | | |
| 0x0010 | N1C+L | | N2C+L | | INFSIZE | | T-PRT | | T-SU | | | | INX | | XT | |
| 0x0020 | NM1(256) | | | | | | | | | | | | | | | |
| 0x0120 | NM2(512) | | | | | | | | | | | | | | | |
| 0x0310 | | | | | | | | | | | | | | | | |

Fig. 19

| | | | | | |
|---|---|---|---|---|---|
| 0x0320 | Reserved(8) | CONTENTSKEY | | | |
| | Reserved(8) | MAC | | | |
| | Reserved(12) | | A | LT | FNo |
| | MG(D)SERIAL-nnn | | | | |
| 0x0360 | CONNUM | YMDhms-S | YMDhms-E | MT | CT | CC | CN |

Fig. 20 bit7:MODE OF ATRAC3    0:Dual    1:Joint bit6,5,4   N OF 3 BITS:MODE VALUE

| N | MODE | TIME | TRANSMISSION RATE | SU | BYTES |
|---|------|------|-------------------|-----|-------|
| 7 | HQ | 47min | 176kbps | 31SU | 512 |
| 6 |  | 58min | 146kbps | 38SU | 424 |
| 5 | EX | 64min | 132kbps | 42SU | 384 |
| 4 | SP | 81min | 105kbps | 53SU | 304 |
| 3 |  | 90min | 94kbps | 59SU | 272 |
| 2 | LP | 128min | 66kbps | 84SU | 192 |
| 1 | mono | 181min | 47kbps | 119SU | 136 |
| 0 | mono | 258min | 33kbps | 169SU | 96 | bit3:Reserved bit2:DATA TYPE          0:AUDIO           1:OTHER bit1:REPRODUCTION SKIP   0:NORMAL REP   1:SKIP bit0:EMPHASIS           0:OFF              1:ON(50/15 $\mu$S)

Fig. 21

```
     bit7    :COPY PERMISSION    0:COPY PROHIBITION    1:COPY PERMISSION
     bit6    :GENERATION    0:ORIGINAL     1:FIRST OR LATER COPY GENERATION
HCMS bit5-4  :COPY CONTROL FOR HIGH SPEED DIGITAL COPY
              00:COPY PROHIBITION  01:COPY FIRST GENERATION 10:COPY PERMISSION
              COPY OPERATION OF CHILD OF FIRST COPY GENERATION IS PROHIBITED.
     bit3-2  MagicGate AUTHENTICATION LEVEL
              00:Level10(Non-MG)      01:Level1
              10:Level2               11:Reserved
              DIVIDE AND COMBINE ARE PROHIBITED IN OTHER THAN LEVEL 10.
     bit1,0   Reserved
```

Fig. 22

| | | | |
|---|---|---|---|
| 0x0370 | PRTSIZE | PRTKEY | Reserved(8) |
| 0x0380 | CONNUM0 | PRTSIZE(0x0388) | PRTKEY |
| 0x0390 | Reserved(8) | | CONNUM0 |

Fig. 23

| | | | | | |
|---|---|---|---|---|---|
| 0x4000 | BLKID-A3D | Reserved | MCode | CONNUM0 | BLOCK SERIAL |
| 0x4010 | BLOCK SEED | | | INITILIZATION VECTOR | |
| 0x4020 | SU-000(Nbyte=384byte) | | | | |

*Fig.* 29
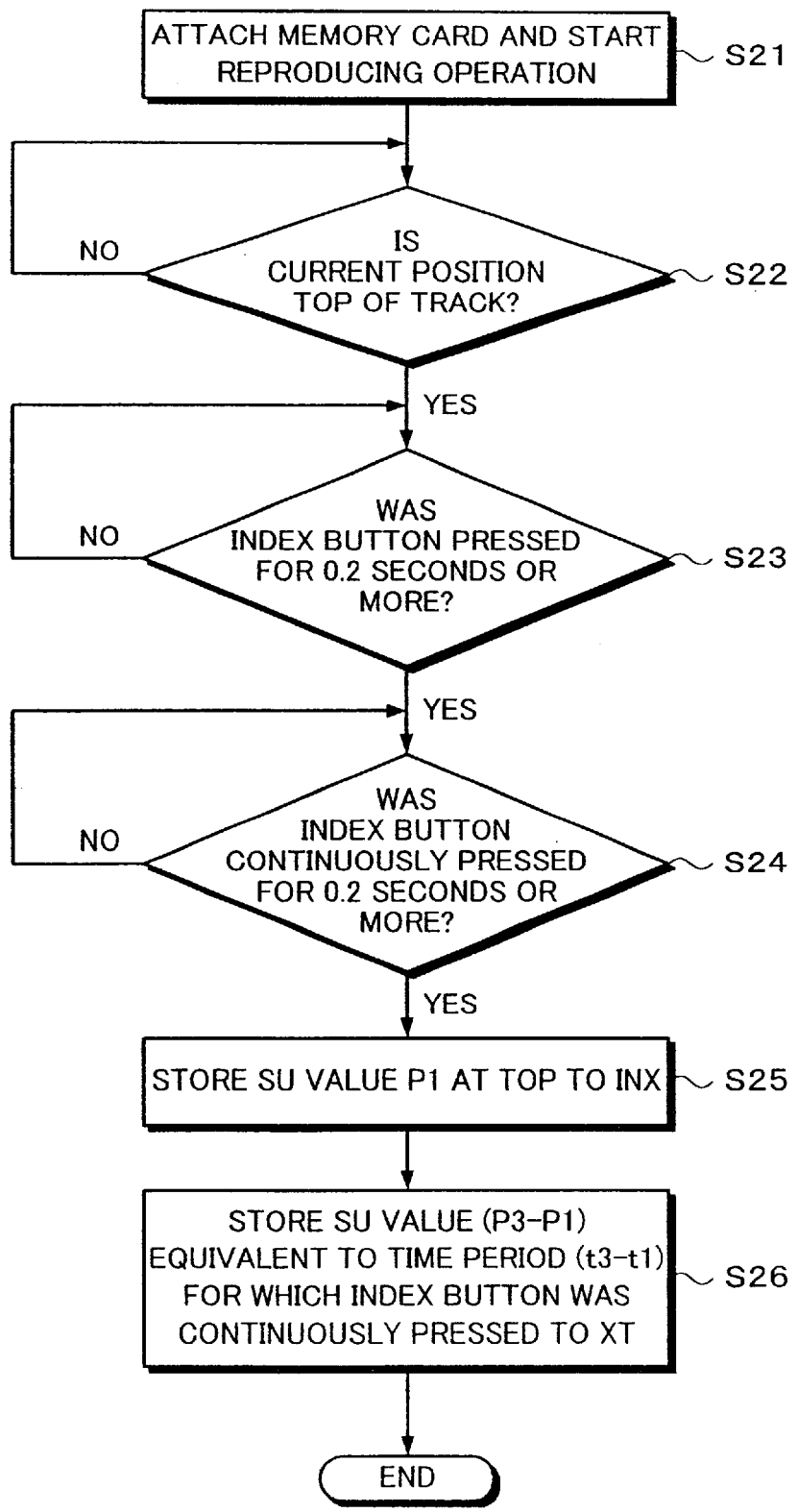

EDITING APPARATUS, EDITING METHOD, AND NON-VOLATILE MEMORY

This is a divisional of application Ser. No. 09/645,751 filed Aug. 24, 2000, now U.S. Pat. No. 6,580,647, issued Jun. 17, 2003.

BACKGROUND OF THE INVENTION

1. Field of the Invention

The present invention relates to an editing apparatus, an editing method, and a non-volatile memory that allow the user to designate a digest portion of a program/album and the position and the period of the designated digest portion to be recorded to a management area.

2. Description of the Related Art

EEPROM (Electrically Erasable Programmable ROM) that is an electrically rewritable memory requires a large space because each bit is composed of two transistors. Thus, the integration of EEPROM is restricted. To solve this problem, a flash memory that allows one bit to be accomplished with one transistor using all-bit-erase system has been developed. The flash memory is being expected as a successor of conventional record mediums such as magnetic disks and optical discs.

A memory card using a flash memory is also known. The memory card can be freely attached to an apparatus and detached therefrom. A digital audio recording/reproducing apparatus that uses a memory card instead of a conventional CD (Compact Disc) or MD (Mini Disc) can be accomplished.

A conventional digital audio recording/reproducing apparatus, for example, a CD (Compact Disc) player, may have a so-called introduction scan function or music scan function that automatically and successively reproduce top portions (for around 10 seconds) of individual music programs so that the user can quickly know the contents of a CD that is being reproduced. However, such a function allows only the top portions of individual music programs to be reproduced. Thus, the user cannot sometimes know the contents or features of individual music programs.

In addition, a reproducing apparatus that reproduces a designated digest portion of a desired music program of a video CD has been proposed. Since a video CD is a reproduction-only disc, a digest portion designated by a producer (who is a contents holder or a record company) is pre-recorded. In other words, the user cannot designate his or her desired digest portion for a video CD.

Alternatively, digest portions of music programs of discs designated by the user may be stored in a non-volatile memory disposed in a disc reproducing apparatus. In this case, the digest portions of the music programs are correlated with identifiers of the discs as a table. The correlated table is stored in the non-volatile memory. With reference to the identifier of a disc loaded to the reproducing apparatus and the table stored in the non-volatile memory, a relevant digest portion is reproduced.

However, since the digest information is not recorded on a disc, it is necessary to reference the table stored in the non-volatile memory of the reproducing apparatus. Thus, the process of the microcomputer of the apparatus becomes heavy. As a result, it takes a long time to reproduce the relevant digest portion.

In addition, conventionally, digest information of each album is not recorded, but each music program.

OBJECTS AND SUMMARY OF THE INVENTION

Therefore, an object of the present invention is to provide a non-volatile memory and a recording/reproducing apparatus that allow the user to designate index information of music programs.

Another object of the present invention is to provide a non-volatile memory having a variable compression ratio so as to allow digest portions of a plurality of albums to be recorded along with contents of a plurality of discs.

A first aspect of the present invention is an editing apparatus for editing a digest portion of a program recorded on a non-volatile memory, comprising an input means for allowing the user to input a start position and an end position of the digest portion, a generating means for generating a start address and digest period information of the digest portion corresponding to the start address and the end position, and a recording means for recording the start address and the digest period information of the digest portion to the non-volatile memory.

A second aspect of the present invention is an editing method for editing a digest portion of a program recorded on a non-volatile memory, comprising the steps of causing the user to input a start position and an end position of the digest portion, generating a start address and digest period information of the digest portion corresponding to the start position and the end position, and recording the start address and the digest period information of the digest portion to the non-volatile memory.

A third aspect of the present invention is a non-volatile memory for recording a program composed of a plurality of blocks, wherein one of the plurality of blocks is used as an attribute information area for attribute information, wherein each of the other blocks is composed of a header portion and a main data portion, and wherein a start address and digest period information of a digest portion designated by the user is written to the attribute information area.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 11 is a schematic diagram showing the data structure of a reproduction management file PBLIST;

FIG. 12A is a schematic diagram showing the data structure of a header portion of the reproduction management file PBLIST;

FIG. 12B is a schematic diagram showing the data structure of a main data portion of the reproduction management file PBLIST;

FIG. 12C is a schematic diagram showing the data structure of an additional information data portion of the reproduction management file PBLIST;

FIG. 13 is a table that correlates showing types of additional information data and code values thereof;

FIG. 14 is a table that correlates showing types of additional information data and code values thereof;

FIG. 15 is a table that correlates showing types of additional information data and code values thereof;

FIG. 17 is a schematic diagram showing a detailed data structure of an ATRAC3 data file;

FIG. 18 is a schematic diagram showing the data structure of an upper portion of an attribute header that composes an ATRAC3 data file;

FIG. 19 is a schematic diagram showing the data structure of a middle portion of the attribute header that composes an ATRAC3 data file;

FIG. 20 is a table that correlates record modes, record time, and so forth;

FIG. 21 is a table showing copy control states;

FIG. 22 is a schematic diagram showing the data structure of a lower portion of the attribute header that composes an ATRAC3 data file;

FIG. 23 is a schematic diagram showing the data structure of a header of a data block of an ATRAC3 data file;

FIG. 29 is a flow chart showing a digest portion designating process according to the second embodiment of the present invention.

DETAILED DESCRIPTION OF THE PREFERRED EMBODIMENTS

Figure 1:
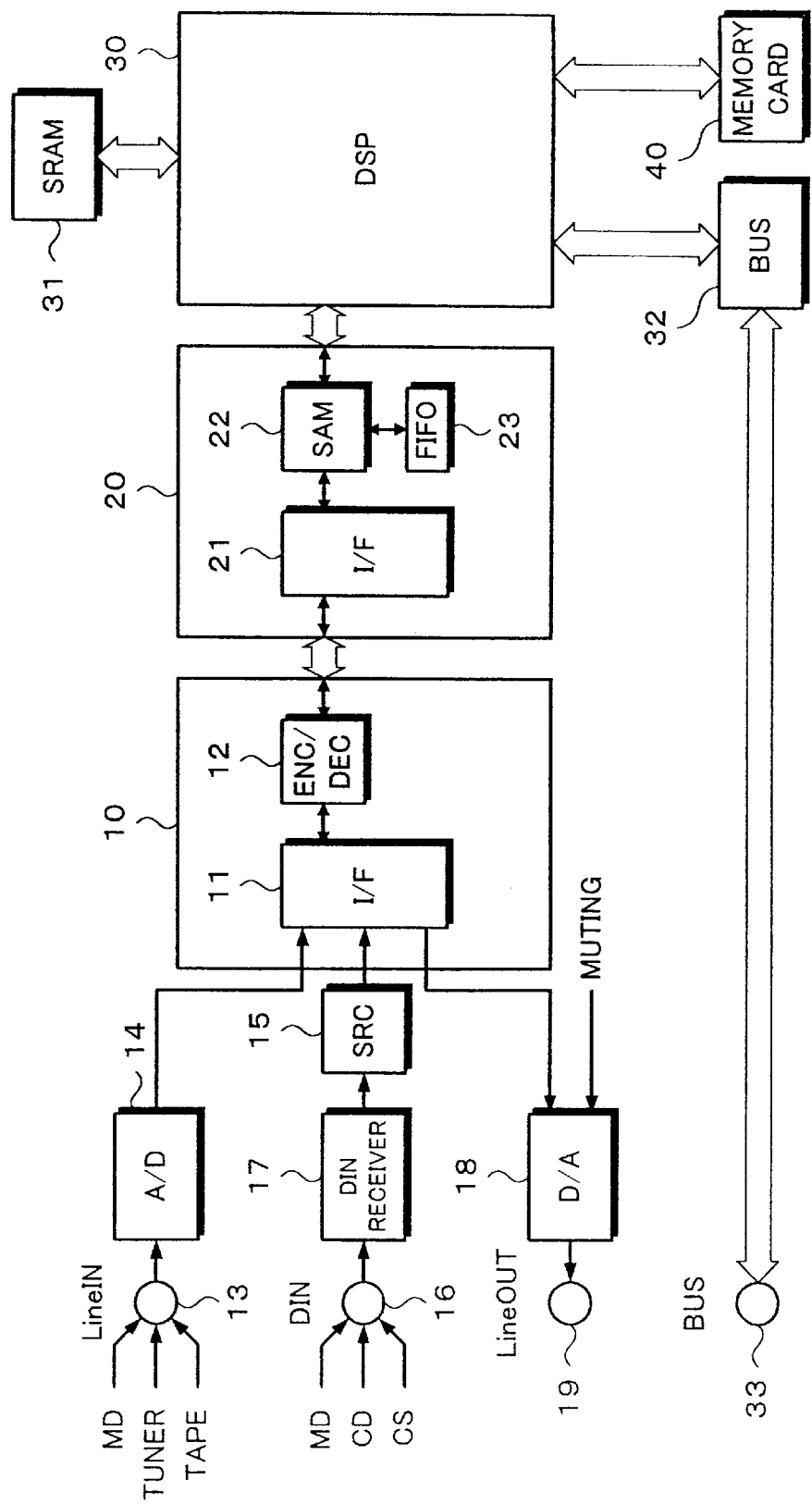
FIG. 1 is a block diagram showing the structure of a digital audio recorder/player using a nonvolatile memory card according to the present invention.

Next, an embodiment of the present invention will be described. FIG. 1 is a block diagram showing the structure of a digital audio recorder/player using a memory card according to an embodiment of the present invention. The digital audio recorder/player records and reproduces a digital audio signal using a detachable memory card. In reality, the recorder/player composes an audio system along with an amplifying unit, a speaker, a CD player, an MD recorder, a tuner, and so forth. However, it should be noted that the present invention can be applied to other audio recorders. In other words, the present invention can be applied to a portable recording/reproducing apparatus. In addition, the present invention can be applied to a set top box that records a digital audio data that is circulated as a satellite data communication, a digital broadcast, or Internet. Moreover, the present invention can be applied to a system that records/reproduces moving picture data and still picture data rather than audio data. The system according to the embodiment of the present invention can record and reproduce additional information such as picture and text other than a digital audio signal.

The recording/reproducing apparatus has an audio encoder/decoder IC 10, a security IC 20, a DSP (Digital Signal Processor) 30. Each of these devices is composed of a one-chip IC. The recording/reproducing apparatus has a detachable memory card 40. The one-chip IC of the memory card 40 has flash memory (nonvolatile memory), a memory control block, and a security block. The security block has a DES (Data Encryption Standard) encrypting circuit. According to the embodiment, the recording/reproducing apparatus may use a microcomputer instead of the DSP 30.

The audio encoder/decoder IC 10 has an audio interface 11 and an encoder/decoder block 12. The encoder/decoder block 12 encodes a digital audio data corresponding to a highly efficient encoding method and writes the encoded data to the memory card 40. In addition, the encoder/decoder block 12 decodes encoded data that is read from the memory card 40. As the highly efficient encoding method, the ATRAC3 format that is a modification of the ATRAC (Adaptive Transform Acoustic Coding) format used in Mini-Disc is used.

In the ATRAC3 format, audio data sampled at 44.1 kHz and quantized with 16 bits is highly efficiently encoded. In the ATRAC3 format, the minimum data unit of audio data that is processed is a sound unit (SU). 1 SU is data of which data of 1024 samples (1024×16 bits×2 channels) is compressed to data of several hundred bytes. The duration of 1 SU is around 23 msec. In the highly efficient encoding method, the data amount of audio data is compressed to data that is around 10 times smaller than that of original data. As with the ATRAC1 format used in Mini-Disc, the audio signal compressed and decompressed corresponding to the ATRAC3 format less deteriorates in the audio quality.

A line input selector 13 selectively supplies the reproduction output signal of an MD, the output signal of a tuner, or a reproduction output signal of a tape to an A/D converter 14. The A/D converter 14 converts the input line signal to a digital audio signal (sampling frequency=44.1 kHz; the number of quantizing bits=16). A digital input selector 16 selectively supplies a digital output signal of an MD, a CD, or a CS (Satellite Digital Broadcast) to a digital input receiver 17. The digital input signal is transmitted through for example an optical cable. An output signal of the digital input receiver 17 is supplied to a sampling rate converter 15. The sampling rate converter 15 converts the digital input signal into a digital audio signal (sampling frequency=44.1 kHz; the number of quantizing bits=16).

The encoder/decoder block 12 of the audio encoder/decoder IC 10 supplies encoded data to a DES encrypting circuit 22 through an interface 21 of the security IC 20. The DES encrypting circuit 22 has a FIFO 23. The DES encrypting circuit 22 is disposed so as to protect the copyright of contents. The memory card 40 also has a DES encrypting circuit. The DES encrypting circuit 22 of the recording/reproducing apparatus has a plurality of master keys and an apparatus-unique storage key. The DES encrypting circuit 22 also has a random number generating circuit. The DES encrypting circuit 22 can share an authenticating process and a session key with the memory card 40 that has the DES encrypting circuit. In addition, the DES encrypting circuit 22 can re-encrypt data with the storage key of the DES encrypting circuit.

The encrypted audio data that is output from the DES encrypting circuit 22 is supplied to a DSP (Digital Signal Processor) 30. The DSP 30 communicates with the memory card 40 through an interface. In this example, the memory card 40 is attached to an attaching/detaching mechanism (not shown) of the recording/reproducing apparatus. The DSP 30 writes the encrypted data to the flash memory of the memory card 40. The encrypted data is serially transmitted between the DSP 30 and the memory card 40. In addition, an external SRAM (Static Random Access Memory) 31 is connected to the DSP 30. The SPAM 31 provides the recording/reproducing apparatus with a sufficient storage capacity so as to control the memory card 40.

A bus interface 32 is connected to the DSP 30. Data is supplied from an external controller (not shown) to the DSP 30 through a bus 33. The external controller controls all operations of the audio system. The external controller supplies data such as a record command or a reproduction command that is generated corresponding to a user's operation through an operation portion to the DSP 30 through the bus interface 32. In addition, the external controller supplies additional information such as image information and character information to the DSP 30 through the bus interface 32. The bus 33 is a bidirectional communication path. Additional information that is read from the memory card 40 is supplied to the external controller through the DSP 30, the bus interface 32, and the bus 33. In reality, the external controller is disposed in for example an amplifying unit of the audio system. In addition, the external controller causes a display portion to display additional information, the operation state of the recorder, and so forth. The display portion is shared by the audio system. Since data that is exchanged through the bus 33 is not copyright protected data, it is not encrypted.

The encrypted audio data that is read from the memory card 40 by the DSP 30 is decrypted by the security IC 20. The audio encoder/decoder IC 10 decodes the encoded data corresponding to the ATRAC3 format. Output data of the audio encoder/decoder 10 is supplied to a D/A converter 18. The D/A converter 18 converts the output data of the audio encoder/decoder 10 into an analog signal. The analog audio signal is supplied to a line output terminal 19.

The analog audio signal is supplied to an amplifying unit (not shown) through the line output terminal 19. The analog audio signal is reproduced from a speaker or a head set. The external controller supplies a muting signal to the D/A converter 18. When the muting signal represents a mute-on state, the external controller prohibits the audio signal from being output from the line output terminal 19.

Figure 2:
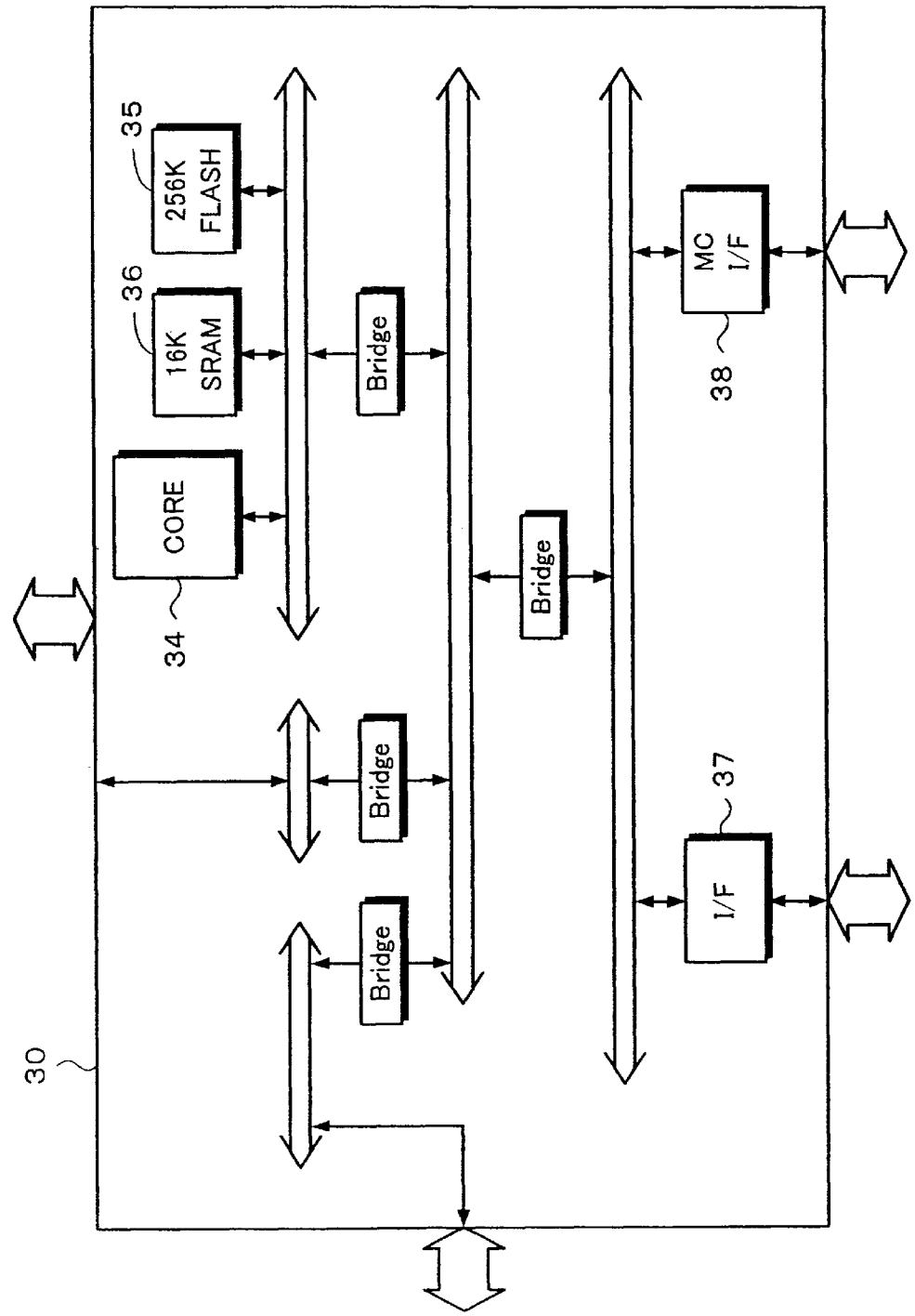
FIG. 2 is a block diagram showing the internal structure of a DSP 30 according to the present invention.

FIG. 2 is a block diagram showing the internal structure of the DSP 30. Referring to FIG. 2, the DSP 30 comprises a core 34, a flash memory 35, an SRAM 36, a bus interface 37, a memory card interface 38, and inter-bus bridges. The DSP 30 has the same function as a microcomputer. The core 34 is equivalent to a CPU. The flash memory 35 stores a program that causes the DSP 30 to perform predetermined processes. The SRAM 36 and the external SRAM 31 are used as a RAM of the recording/reproducing apparatus.

The DSP 30 controls a writing process for writing encrypted audio data and additional information to the memory card 40 corresponding to an operation signal such as a record command received through the bus interfaces 32 and 37 and a reading process for reading them therefrom. In other words, the DSP 30 is disposed between the application software side of the audio system that records/reproduces audio data and additional information and the memory card 40. The DSP 30 is operated when the memory card 40 is accessed. In addition, the DSP 30 is operated corresponding to software such as a file system.

The DSP 30 manages files stored in the memory card 40 with the FAT system used in conventional personal computers. In addition to the file system, according to the embodiment of the present invention, a management file is used. The management file will be described later. The management file is used to manage data files stored in the memory card 40. The management file as the first file management information is used to manage audio data files. On the other hand, the FAT as the second file management information is used to mange all files including audio data files and management files stored in the flash memory of the memory card 40. The management file is stored in the memory card 40. The FAT is written to the flash memory along with the route directory and so forth before the memory card 40 is shipped. The details of the FAT will be described later.

According to the embodiment of the present invention, to protect the copyright of data, audio data that has been compressed corresponding to the ATRAC3 format is encrypted. On the other hand, since it is not necessary to protect the copyright of the management file, it is not encrypted. There are two types of memory cards that are an encryption type and a non-encryption type. However, a memory card for use with the recorder/player that records copyright protected data is limited to the encryption type.

Voice data and image data that are recorded by users are recorded on non-encryption type memory cards.

Figure 3:
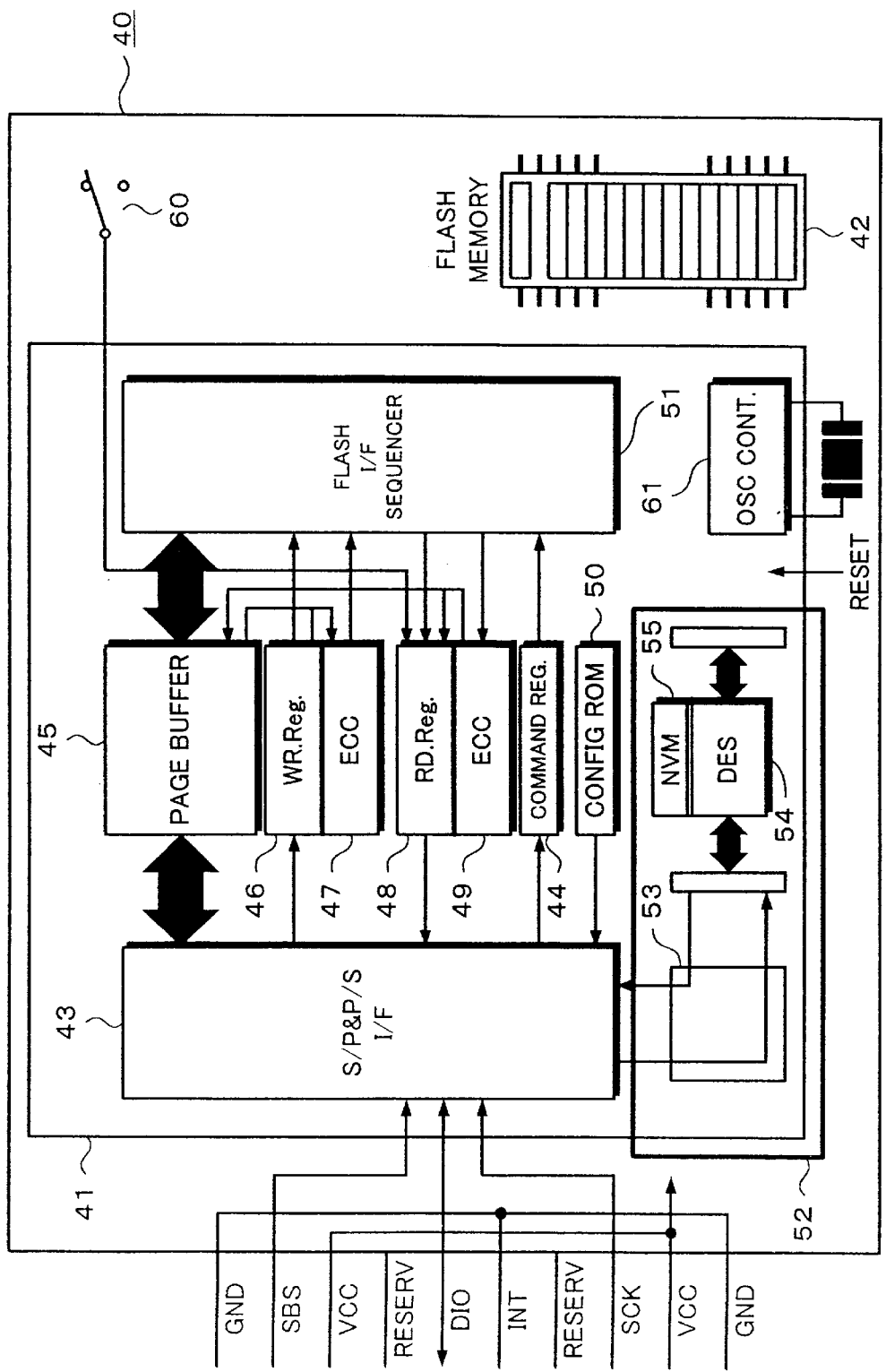
FIG. 3 is a block diagram showing the internal structure of a memory card 40 according to the present invention.

FIG. 3 is a block diagram showing the internal structure of the memory card 40. The memory card 40 comprises a control block 41 and a flash memory 42 that are structured as a one-chip IC. A bidirectional serial interface is disposed between the DSP 30 of the recorder/player and the memory card 40. The bidirectional serial interface is composed of ten lines that are a clock line SCK for transmitting a clock signal that is transmitted along with data, a status line SBS for transmitting a signal that represents a status, a data line DIO for transmitting data, an interrupt line INT, two GND lines, two VCC lines, and two reserved lines.

The clock line SCK is used for transmitting a clock signal in synchronization with data. The status line SBS is used for transmitting a signal that represents the status of the memory card 40. The data line DIO is used for inputting and outputting a command and encrypted audio data. The interrupt line INT is used for transmitting an interrupt signal that causes the memory card 40 to interrupt the DSP 30 of the recorder/player. When the memory card 40 is attached to the recorder/player, the memory card 40 generates the interrupt signal. However, according to the embodiment of the present invention, since the interrupt signal is transmitted through the data line DIO, the interrupt line INT is grounded.

A serial/parallel converting, parallel/serial converting, and interface block (S/P, P/S, I/F block) 43 is an interface disposed between the DSP 30 of the recorder/player and the control block 41 of the memory card 40. The S/P, P/S, and IF block 43 converts serial data received from the DSP 30 of the recorder/player into parallel data and supplies the parallel data to the control block 41. In addition, the S/P, P/S, and IF block 43 converts parallel data received from the control block 41 into serial data and supplies the serial data to the DSP 30. When the S/P, P/S, and IF block 43 receives a command and data through the data line DIO, the S/P, P/S, and IF block 43 separates them into these that are normally accessed to the flash memory 42 and those that are encrypted.

In the format of which data is transmitted through the data line DIO, after a command is transmitted, data is transmitted. The S/P, P/S, and IF block 43 detects the code of a command and determines whether the command and data are those that are normally accessed or those that are encoded. Corresponding to the determined result, the S/P, P/S, and IF block 43 stores a command that is normally accessed to a command register 44 and stores data that is normally accessed to a page buffer 45 and a write register 46. In association with the write register 46, the memory card 40 has an error correction code encoding circuit 47. The error correction code encoding circuit 47 generates a redundant code that is an error correction code for data temporarily stored in the page buffer 45.

Output data of the command register 44, the page buffer 45, the write register 46, and the error correction code encoding circuit 47 is supplied to a flash memory interface and sequencer (hereinafter, referred to as memory I/F and sequencer) 51. The memory IF and sequencer 51 is an interface disposed between the control block 41 and the flash memory 42 and controls data exchanged therebetween. Data is written to the flash memory through the memory IF and sequencer 51.

Audio data that has been compressed corresponding to the ATRAC3 format and written to the flash memory (hereinafter, this audio data is referred to as ATRAC3 data) is encrypted by the security IC 20 of the recorder/player and the security block 52 of the memory card 40 so as to protect the copyright of the ATRAC3 data. The security block 52 comprises a buffer memory 53, a DES encrypting circuit 54, and a nonvolatile memory 55. The security block 52 of the memory card 40 has a plurality of authentication keys and a unique storage key for each memory card. The nonvolatile memory 55 stores a key necessary for encrypting data. The key stored in the nonvolatile memory 55 cannot be analyzed. According to the embodiment, for example, a storage key is stored in the nonvolatile memory 55. The security block 52 also has a random number generating circuit. The security block 52 authenticates an applicable recorder/player and shares a session key therewith. In addition, the security block 52 re-encrypts contents with the storage key through the DSE encrypting circuit 54.

For example, when the memory card 40 is attached to the recorder/player, they are mutually authenticated. The security IC 20 of the recorder/player and the security block 52 of the memory card 40 mutually authenticate. When the recorder/player has authenticated the attached memory card 40 as an applicable memory card and the memory card 40 has authenticated the recorder/player as an applicable recorder/player, they are mutually authenticated. After the mutual authenticating process has been successfully performed, the recorder/player and the memory card 40 generate respective session keys and share them with each other. Whenever the recorder/player and the memory card 40 authenticate each other, they generate respective session keys.

When contents are written to the memory card 40, the recorder/player encrypts a contents key with a session key and supplies the encrypted data to the memory card 40. The memory card 40 decrypts the contents key with the session key, re-encrypts the contents key with a storage key, and supplies the contents key to the recorder/player. The storage key is a unique key for each memory card 40. When the recorder/player receives the encrypted contents key, the recorder/player performs a formatting process for the encrypted contents key, and writes the encrypted contents key and the encrypted contents to the memory card 40.

In the above section, the writing process for the memory card 40 was described. In the following, the reading process for the memory card 40 will be described. Data that is read from the flash memory 42 is supplied to the page buffer 45, the read register 48, and the error correction circuit 49 through the memory IF and the sequencer 51. The error correcting circuit 49 corrects an error of the data stored in the page buffer 45. Output data of the page buffer 45 that has been error-corrected and the output data of the read register 48 are supplied to the S/P, P/S, and IF block 43. The output data of the S/P, P/S, and IF block 43 is supplied to the DSP 30 of the recorder/player through the above-described serial interface.

When data is read from the memory card 40, the contents key encrypted with the storage key and the contents encrypted with the block key are read from the flash memory 42. The security block 52 decrypts the contents key with the storage key. The security block 52 re-encrypts the decrypted content key with the session key and transmits the re-encrypted contents key to the recorder/player. The recorder/player decrypts the contents key with the received session key and generates a block key with the decrypted contents key. The recorder/player successively decrypts the encrypted ATRAC3 data.

A config. ROM 50 is a memory that stores partition information, various types of attribute information, and so forth of the memory card 40. The memory card 40 also has an erase protection switch 60. When the switch 60 is in the erase protection position, even if a command that causes the memory card 40 to erase data stored in the flash memory 42 is supplied from the recorder/player side to the memory card 40, the memory card 40 is prohibited from erasing the data stored in the flash memory 42. An OSC cont. 61 is an oscillator that generates a clock signal that is the reference of the timing of the process of the memory card 40.

Figure 4:
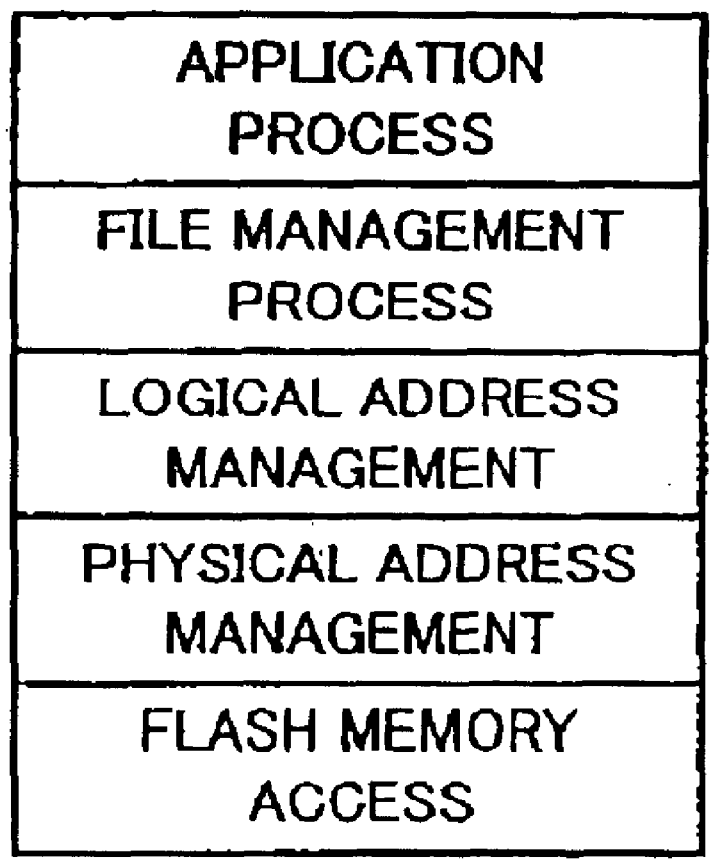
FIG. 4 is a schematic diagram showing a file management structure of a memory card as a storage medium according to the present invention.

FIG. 4 is a schematic diagram showing the hierarchy of the processes of the file system of the computer system that uses a memory card as a storage medium. On the hierarchy, the top hierarchical level is an application process layer. The application process layer is followed by a file management process layer, a logical address management layer, a physical address management layer, and a flash memory access layer. In the above-mentioned hierarchical structure, the file management process layer is the FAT file system. Physical addresses are assigned to individual blocks of the flash memory. The relation between the blocks of the flash memory and the physical addresses thereof does not vary. Logical addresses are addresses that are logically handled on the file management process layer.

Figure 5:
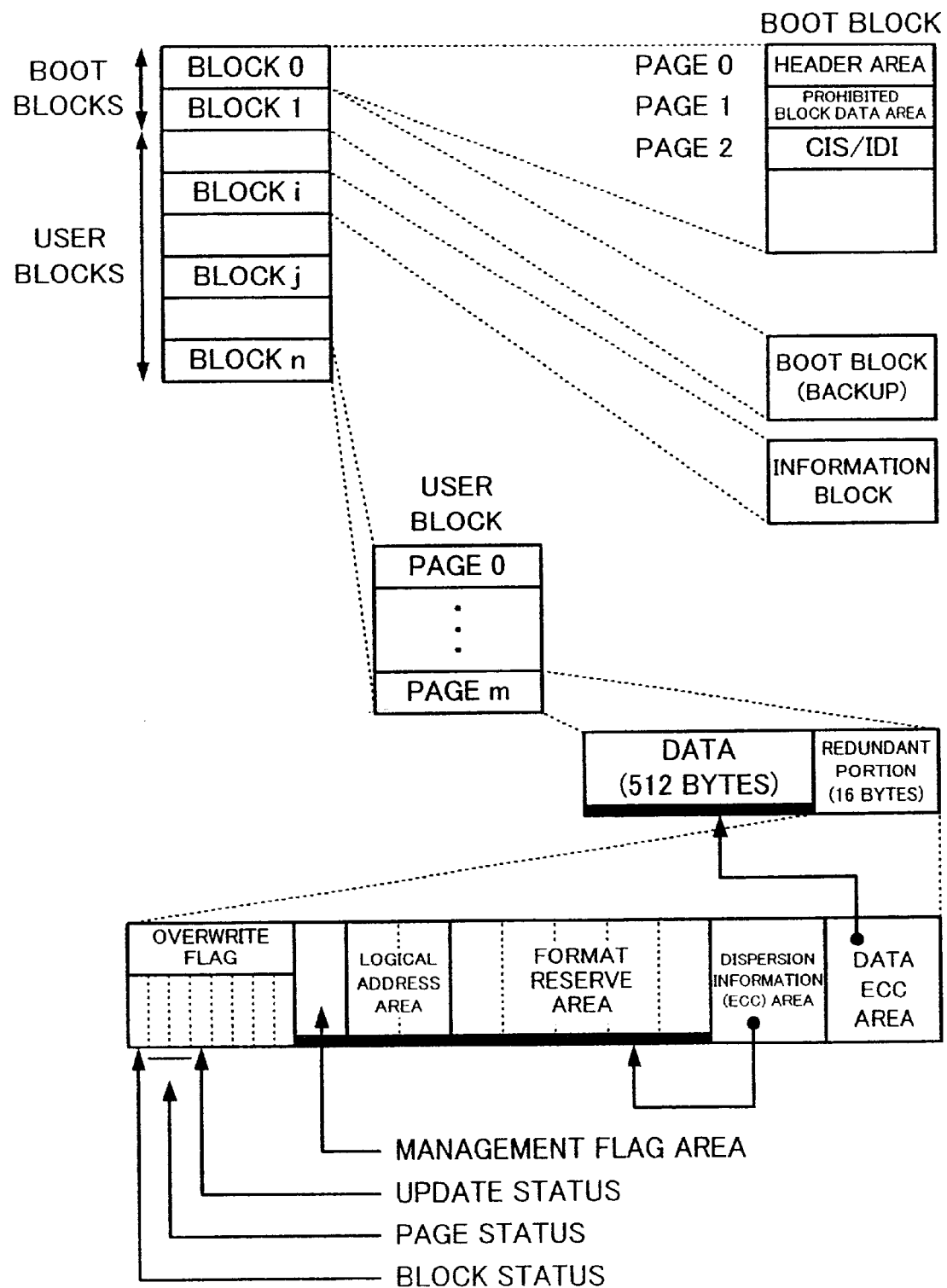
FIG. 5 is a schematic diagram showing the physical structure of data in a flash memory 42 of the memory card 40 according to the present invention.

FIG. 5 is a schematic diagram showing the physical structure of data handled in the flash memory 42 of the memory card 40. In the memory 42, a data unit (referred to as segment) is divided into a predetermined number of blocks (fixed length). One block is divided into a predetermined number of pages (fixed length). In the flash memory, data is erased as each block at a time. Data is written to the flash memory 42 or read therefrom as a page at a time. The size of each block is the same. Likewise, the size of each page is the same. One block is composed of page 0 to page m. For example, one block has a storage capacity of for example 8 KB (kilobytes) or 16 KB. One page has a storage capacity of 512 B (bytes). When one block has a storage capacity of 8 KB, the total storage capacity of the flash memory 42 is 4 MB (512 blocks) or 8 MB (1024 blocks). When one block has a storage capacity of 16 KB, the total storage capacity of the flash memory 42 is 16 MB (1024 blocks), 32 MB (2048 blocks), or 64 MB (4096 blocks).

One page is composed of a data portion of 512 bytes and a redundant portion of 16 bytes. The first three bytes of the redundant portion is an overwrite portion that is rewritten whenever data is updated. The first three bytes successively contain a block status area, a page status area, and an update status area. The remaining 13 bytes of the redundant portion are fixed data that depends on the contents of the data portion. The 13 bytes contain a management flag area (1 byte), a logical address area (2 bytes), a format reserve area (5 bytes), a dispersion information ECC area (2 bytes), and a data ECC area (3 bytes). The dispersion information ECC area contains redundant data for an error correction process against the management flag area, the logical address area, and the format reserve area. The data ECC area contains redundant data for an error correction process against 512-byte data.

The management flag area contains a system flag (1: user block, 0: boot block), a conversion table flag (1: invalid, 0: table block), a copy prohibition flag (1: OK, 0: NG), and an access permission flag (1: free, 0: read protect).

The first two blocks—blocks 0 and 1 are boot blocks. The block 1 is a backup of the block 0. The boot blocks are top blocks that are valid in the memory card. When the memory card is attached to the recorder/player, the boot blocks are accessed at first. The remaining blocks are user blocks. Page 0 of the boot block contains a header area, a system entry area, and a boot and attribute information area. Page 1 of the boot block contains a prohibited block data area. Page 2 of the boot block contains a CIS (Card Information Structure)/IDI (identify Drive Information) area.

The header area of the boot block contains a boot block ID and the number of effective entries. The system entries are the start position of prohibited block data, the data size thereof, the data type thereof, the data start position of the CIS/IDI area, the data size thereof, and the data type thereof. The boot and attribute information contains the memory card type (read only type, rewritable type, or hybrid type), the block size, the number of blocks, the number of total blocks, the security/non-security type, the card fabrication data (date of fabrication), and so forth.

Since the flash memory has a restriction for the number of rewrite times due to the deterioration of the insulation film, it is necessary to prevent the same storage area (block) from being concentratedly accessed. Thus, when data at a particular logical address stored at a particular physical address is rewritten, updated data of a particular block is written to a non-used block rather than the original block. Thus, after data is updated, the relation between the logical address and the physical address changes. This process is referred to as swap process. Consequently, the same block is prevented from being concentratedly accessed. Thus, the service life of the flash memory can be prolonged.

The logical address associates with data written to the block. Even if the block of the original data is different from the block of updated data, the address on the FAT does not change. Thus, the same data can be properly accessed. However, since the swap process is performed, a conversion table that correlates logical addresses and physical addresses is required (this table is referred to as logical-physical address conversion table). With reference to the logical-physical address conversion table, a physical address corresponding to a logical address designated on the FAT is obtained. Thus, a block designated with a physical address can be accessed.

The DSP 30 stores the logical-physical address conversion table in the SRAM. When the storage capacity of the RAM is small, the logical-physical address conversion table can be stored to the flash memory. The logical-physical address conversion table correlates logical addresses (2 bytes) sorted in the ascending order with physical addresses (2 bytes). Since the maximum storage capacity of the flash memory is 128 MB (8192 blocks), 8192 addresses can be assigned with two bytes. The logical-physical address conversion table is managed for each segment. Thus, the size of the logical-physical address conversion table is proportional to the storage capacity of the flash memory. When the storage capacity of the flash memory is 8 MB (two segments), two pages are used as the logical-physical address conversion table for each of the segments. When the conversion table is stored in the flash memory, a predetermined one bit of the management flag area in the redundant portion in each page represents whether or not the current block is a block containing the logical-physical address conversion table.

The above-described memory card can be used with the FAT file system of a personal computer system as with the disc shaped record medium. The flash memory has an IPL area, a FAT area, and a route directory area (not shown in FIG. 5). The IPL area contains the address of a program to be initially loaded to the memory of the recorder/player. In addition, the IPL area contains various types of memory information. The FAT area contains information with respect to blocks (clusters). The FAT has defined unused blocks, next block number, defective blocks, and last block number. The route directory area contains directory entries that are a file attribute, an update date [day, month, year], file size, and so forth.

Next, with reference to FIG. 6, a managing method using the FAT table will be described.

Figure 6:
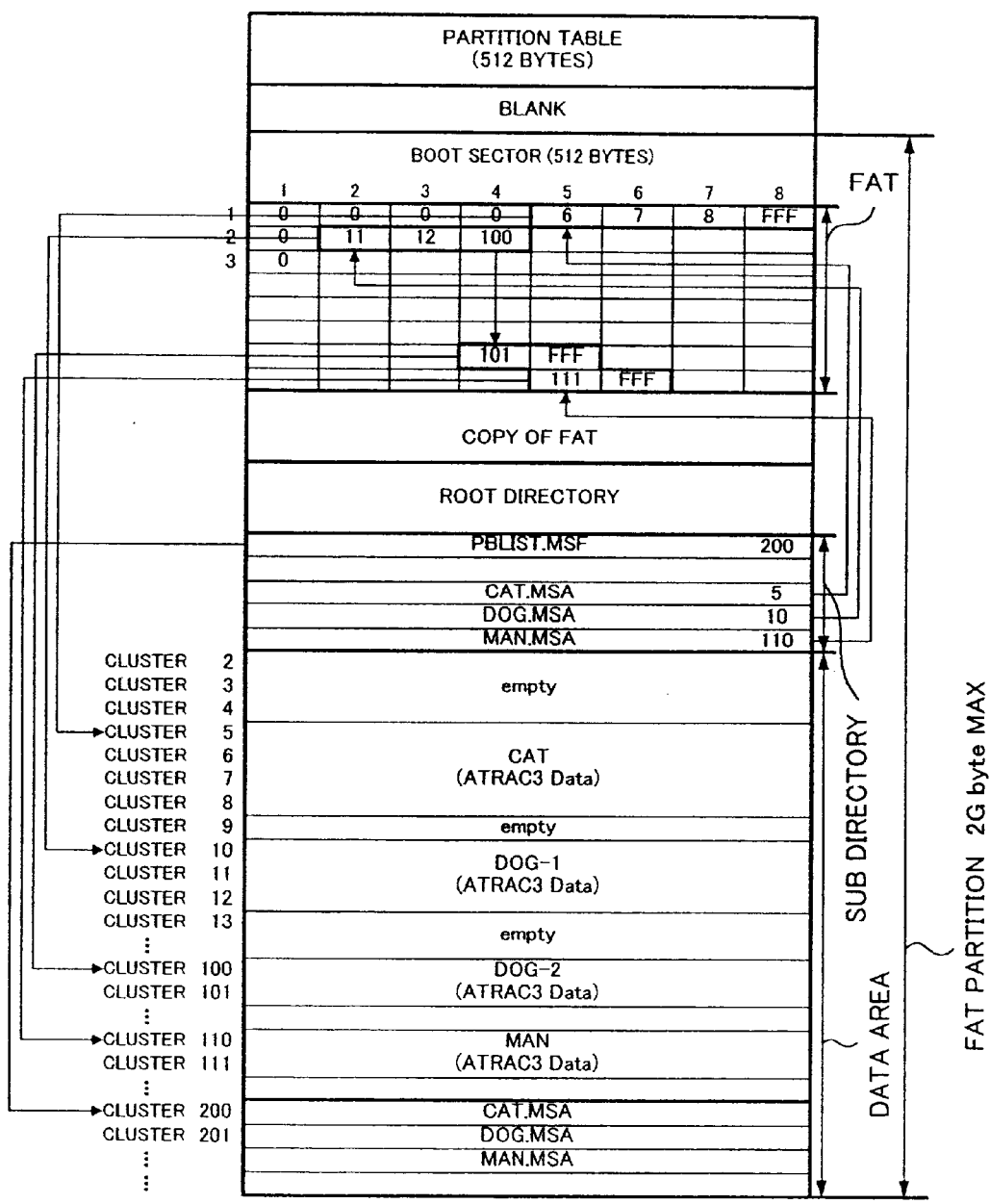
FIG. 6 is a data structure of the memory card 40 according to the present invention.

FIG. 6 is a schematic diagram showing a memory map. The top area of the memory map is a partition table portion. The partition table portion is followed by a block area, a boot sector, a FAT area, a FAT backup area, a root directory area, a sub directory area, and a data area. On the memory map, logical addresses have been converted into physical addresses corresponding to the logical-physical address conversion table.

The boot sector, the FAT area, the FAT backup area, the root directory area, the sub directory area, and the data area are referred to as FAT partition area.

The partition table portion contains the start address and the end address of the FAT partition area.

The FAT used for a conventional floppy disk does not have such a partition table. Since the first track has only a partition table, there is a blank area. The boot sector contains the size of the FAT structure (12 bit FAT or 16 bit FAT), the cluster size, and the size of each area. The FAT is used to manage the position of a file recorded in the data area. The FAT copy area is a FAT backup area. The route directory area contains file names, start cluster addresses thereof, and various attributes thereof. The route directory area uses 32 bytes per file.

The sub directory area is achieved by a directory attribute file as a directory. In the embodiment shown in FIG. 6, the sub directory area has four files named PBLIST.MSF, CAT.MSF, DOG.MSF, and MAN.MFA. The sub directory area is used to manage file names and record positions on the FAT. In other words, the slot of the file name CAT.MSF is assigned address "10" on the FAT. The slot of the file name DOG.MSF is assigned address "10" on the FAT. An area after cluster 2 is used as a data area. In this embodiment, audio data that has been compressed corresponding to the ATRAC3 format is recorded. The top slot of the file name MAN.MSA is assigned address "110" on the FAT. According to the embodiment of the present invention, audio data with the file name CAT.MSF is recorded to cluster 5 to 8. Audio data of DOG-1 as the first half of the file with the file name DOG.MSF is recorded to clusters 10 to 12. Audio data DOG-2 as the second half of the file with the file name DOG.MSF is recorded in clusters 100 and 101. Audio data with the file name MAN.MSF is recorded in clusters 110 and 111.

In the embodiment of the present invention, an example of which a single file is divided into two portions and dispersedly recorded is described. In the embodiment, an area "Empty" in the data area is a recordable area. An area after cluster 200 is used for managing file names. The file CAT.MSF is recorded to cluster 200. The file DOG.MSF is recorded to cluster 201. The file MAN.MSF is recorded to cluster 202. When the positions of the files are changed, the area after cluster 200 is re-arranged. When the memory card is attached, the beginning and the end of the FAT partition area are recorded with reference to the top partition table portion. After the boot sector portion is reproduced, the root directory area and the sub directory area are reproduced. The slot of the reproduction management information PBLIST- .MSF in the sub directory area is detected. Thus, the address of the end portion of the slot of the file PBLIST.MSF is obtained. In the embodiment, since address "200" is recorded at the end of the file PBLIST.MSF, cluster 200 is referenced.

The area after cluster 200 is used for managing the reproduction order of files. In the embodiment, the file CAT.MSA is the first program. The file DOG.MSA is the second program. The file MAN.MSA is the third program. After the area after cluster 200 is referenced, slots of the files CAT.MSA, DOG.MSA, and MAN.MSA are referenced. In FIG. 6, the end of the slot of the file CAT.MSA is assigned address "5". The end of the slot of the file DOG.MSA is assigned address "10". The end of the slot of the file MAN.MSA is assigned address "110". When an entry address is searched on the FAT with address "5", cluster address "6" is obtained. When an entry address is searched on the FAT with address "6", cluster address "7" is obtained. When an entry address is searched on the FAT with address "8", code "FFF" that represents the end is obtained. Thus, the file CAT.MSA uses clusters 5, 6, 7, and 8. With reference to clusters 5, 6, 7, and 8 in the data area, an area of ATRAC3 data with the file name CAT.MSA can be accessed.

Next, a method for searching the file DOG.MSF that has been dispersedly recorded will be described. The end of the slot of the file DOG.MSA is assigned address "10". When an entry address on the FAT is searched with address "10", cluster address "11" is obtained. When an entry address on the FAT is searched with address "11" is referenced, cluster address "12" is obtained. When an entry address on the FAT is searched with address "12" is referenced, cluster address "101" is obtained. When entry address "101" is referenced, code "FFF" that represents the end is obtained. Thus, the file DOG.MSF uses clusters 10, 11, 12, 100, and 101. When clusters 10, 11, and 12 are referenced, the first part of ATRAC3 data of the file DOG.MSF can be accessed. When the clusters 100 and 101 are referenced, the second part of ATRAC3 data of the file DOG.MSF can be accessed. In addition, when an entry address is searched on the FAT with address "110", cluster address "101" is obtained. When an entry address "111" is searched on the FAT with address "101", code "FFF" that represents the end is obtained. Thus, it is clear that the file MAN.MSA uses clusters 110 and 111. As described above, data files dispersed in the flash memory can be linked and sequentially reproduced.

According to the embodiment of the present invention, in addition to the file management system defined in the format of the memory card 40, the management file is used for managing tracks and parts of music files. The management file is recorded to a user block of the flash memory 42 of the memory card 40. Thus, as will be described later, even if the FAT of the memory card 40 is destroyed, a file can be recovered.

The management file is generated by the DSP 30. When the power of the recorder/player is turned on, the DSP 30 determines whether or not the memory card 40 has been attached to the recorder/player. When the memory card has been attached, the DSP 30 authenticates the memory card 40. When the DSP 30 has successfully authenticated the memory card 40, the DSP 30 reads the boot block of the flash memory 42. Thus, the DSP 30 reads the physical-logical address conversion table and stores the read data to the SRAM.

The FAT and the route directory have been written to the flash memory of the memory card 40 before the memory card 40 is shipped. When data is recorded to the memory card 40, the management file is generated.

In other words, a record command issued by the remote controller of the user or the like is supplied to the DSP 30 from the external controller through the bus and the bus interface 32. The encoder/decoder IC 10 compresses the received audio data and supplies the resultant ATRAC3 data to the security IC 20. The security IC 20 encrypts the ATRAC3 data. The encrypted ATRAC3 data is recorded to the flash memory 42 of the memory card 40. Thereafter, the FAT and the management file are updated. Whenever a file is updated (in reality, whenever the recording process of audio data is completed), the FAT and the management file stored in the SRAMs 31 and 36 are rewritten. When the memory card 40 is detached or the power of the recorder/ player is turned off, the FAT and the management file that are finally supplied from the SRAMs 31 and 36 are recorded to the flash memory 42. Alternatively, whenever the recording process of audio data is completed, the FAT and the management file written in the flash memory 42 may be rewritten. When audio data is edited, the contents of the management file are updated.

In the data structure according to the embodiment, additional information is contained in the management file. The additional information is updated and recorded to the flash memory 42. In another data structure of the management file, an additional information management file is generated besides the track management file. The additional information is supplied from the external controller to the DSP 30 through the bus and the bus interface 32. The additional information is recorded to the flash memory 42 of the memory card 40. Since the additional information is not supplied to the security IC 20, it is not encrypted. When the memory card 40 is detached from the recorder/player or the power thereof is turned off, the additional information is written from the SRAM of the DSP 30 to the flash memory 42.

Figure 7:
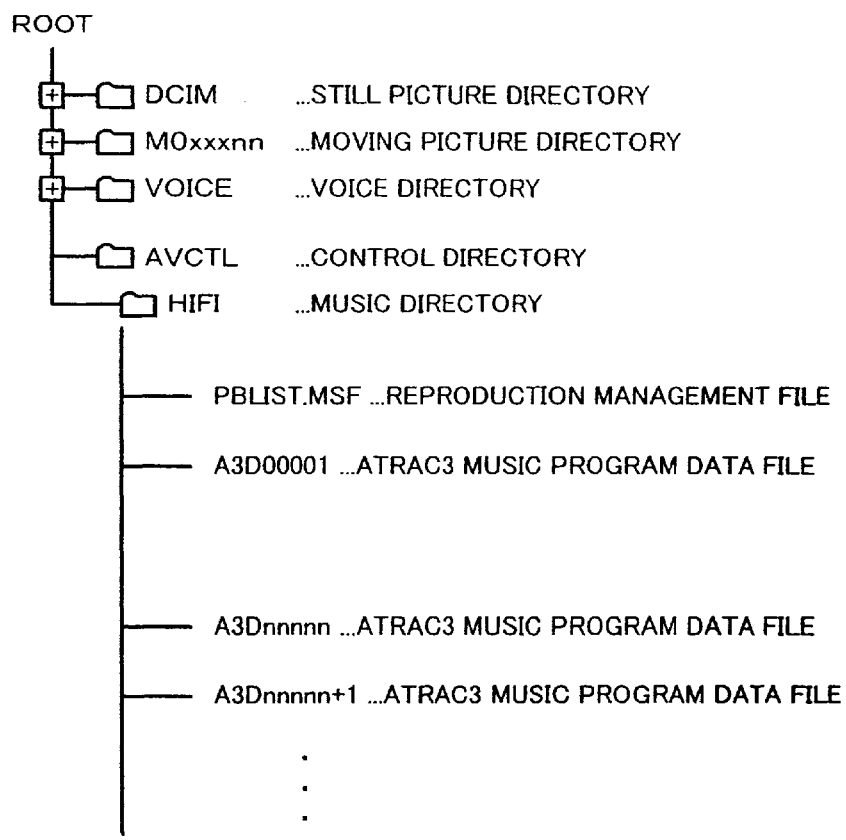
FIG. 7 is a schematic diagram showing the hierarchy of the file structure in the memory card 40.

FIG. 7 is a schematic diagram showing the file structure of the memory card 40. As the file structure, there are a still picture directory, a moving picture directory, a voice directory, a control directory, and a music (HIFI) directory. According to the embodiment, music programs are recorded and reproduced. Next, the music directory will be described. The music directory has two types of files. The first type is a reproduction management file BLIST.MSF (hereinafter, referred to as PBLIST). The other type is an ATRAC3 data file A3Dnnnn.MSA that stores encrypted music data. The music directory can stores up to 400 ATRAC3 data files (namely, 400 music programs). ATRAC3 data files are registered to the reproduction management file and generated by the recorder/player.

Figure 8:
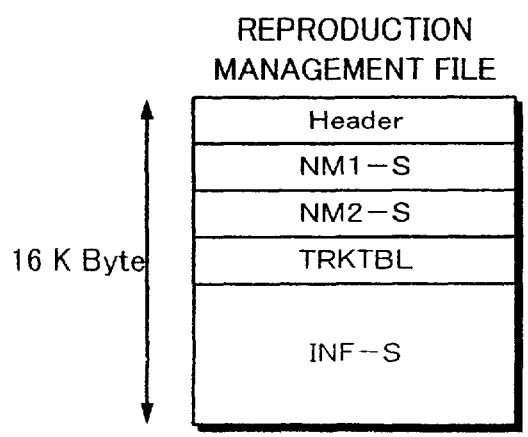
FIG. 8 is a schematic diagram showing the data structure of a reproduction management file PBLIST.MSF that is a sub directory stored in the memory card 40.
Figure 9:
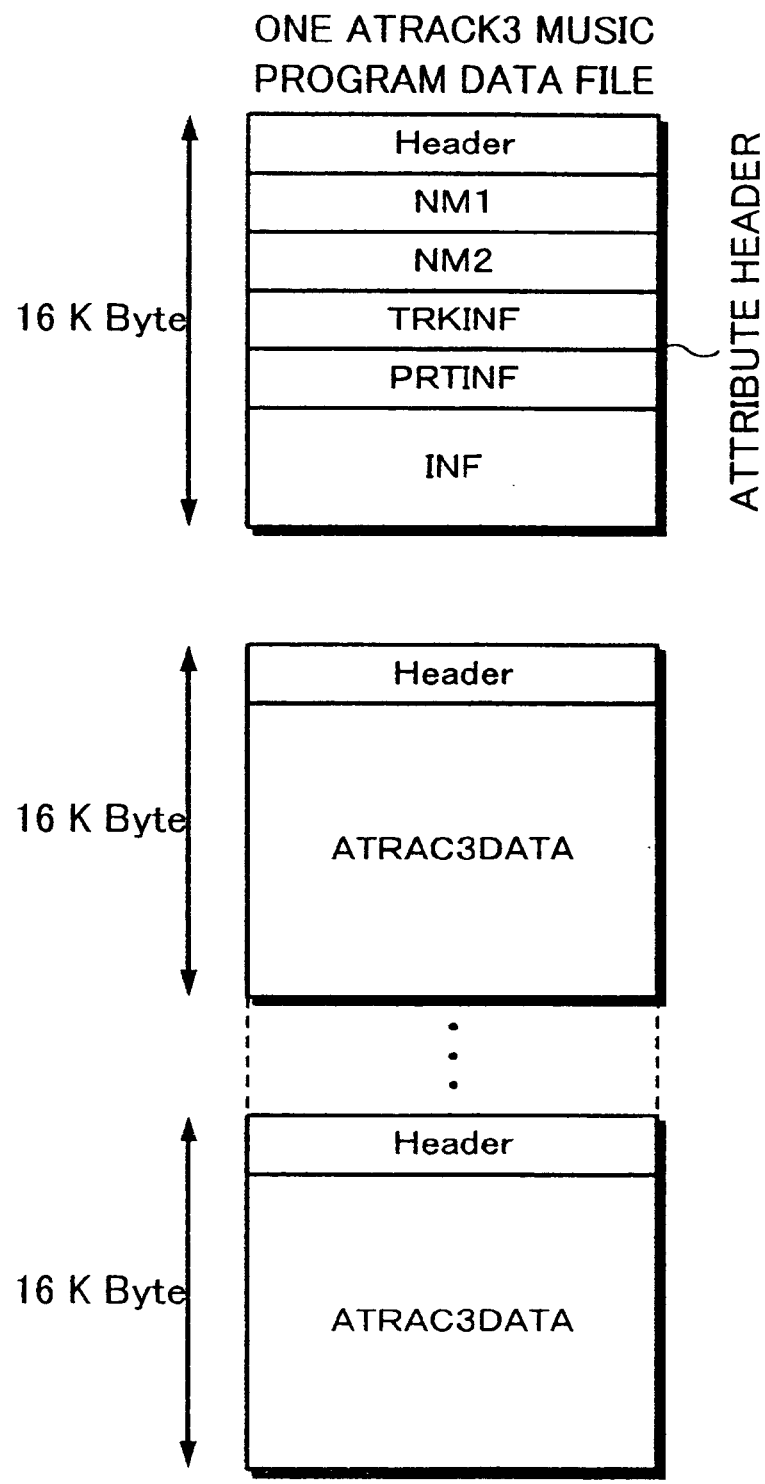
FIG. 9 is a schematic diagram showing the data structure in the case that one ATRAC3 data file is divided into blocks with a predetermined unit length and that attribute files are added thereto.

FIG. 8 is a schematic diagram showing the structure of the reproduction management file. FIG. 9 is a schematic diagram showing the file structure of one ATRAC3 data file. The reproduction management file is a fixed-length file of 16 KB. An ATRAC3 data file is composed of an attribute header and an encrypted music data area for each music program. The attribute data has a fixed length of 16 KB. The structure of the attribute header is similar to that of the reproduction management file.

The reproduction management file shown in FIG. 8 is composed of a header, a memory card name NM1S (for one byte code), a memory card name NM2-S (for two byte code), a program reproduction sequence table TRKTBL, and memory card additional information INF-S. The attribute header (shown in FIG. 9) at the beginning of the data file is composed of a header, a program name NM1 (for one byte code), a program name NM2 (for two byte code), track information TRKINF (such as track key information), part information PRTINF, and track additional information INF. The header contains information of the number of total parts, the attribute of the name, the size of the additional information, and so forth.

The attribute data is followed by ATRAC3 music data. The music data is block-segmented every 16 KB. Each block starts with a header. The header contains an initial value for decrypting encrypted data. Only music data of an ATRAC3 data file is encrypted. Thus, other data such as the reproduction management file, the header, and so forth are not encrypted.

Next, with reference to FIGS. 10A to 10C, the relation between music programs and ATRAC3 data files will be described. One track is equivalent to one music program. In addition, one music program is composed of one ATRAC3 data (see FIG. 9). The ATRAC3 data file is audio data that has been compressed corresponding to the ATRAC3 format. The ATRAC3 data file is recorded as a cluster at a time to the memory card 40. One cluster has a capacity of 16 KB.

A plurality of files are not contained in one cluster. The minimum data erase unit of the flash memory 42 is one block. In the case of the memory card 40 for music data, a block is a synonym of a cluster. In addition, one cluster is equivalent to one sector.

One music program is basically composed of one part. However, when a music program is edited, one music program may be composed of a plurality of parts. A part is a unit of data that is successively recorded. Normally, one track is composed of one part. The connection of parts of a music program is managed with part information PRTINF in the attribute header of each music program. In other words, the part size is represented with part size PRTSIZE (4 bytes) of the part information PRTINF. The first two bytes of the part size PRTSIZE represents the number of total clusters of the current part. The next two bytes represent the positions of the start sound unit (SU) and the end sound unit (SU) of the beginning and last clusters, respectively. Hereinafter, a sound unit is abbreviated as SU. With such a part notation, when music data is edited, the movement of the music data can be suppressed. When music data is edited for each block, although the movement thereof can be suppressed, the edit unit of a block is much larger than the edit unit of a SU.

SU is the minimum unit of a part. In addition, SU is the minimum data unit in the case that audio data is compressed corresponding to the ATRAC3 format. 1 SU is audio data of which data of 1024 samples at 44.1 kHz (1024×16 bits×2 channels) is compressed to data that is around 10 times smaller than that of original data. The duration of 1 SU is around 23 msec. Normally, one part is composed of several thousand SU. When one cluster is composed of 42 SU, one cluster allows a sound of one second to be generated. The number of parts composing one track depends on the size of the additional information. Since the number of parts is obtained by subtracting the header, the program name, the additional data, and so forth from one block, when there is no additional information, the maximum number of parts (645 parts) can be used.

Figure 10A:
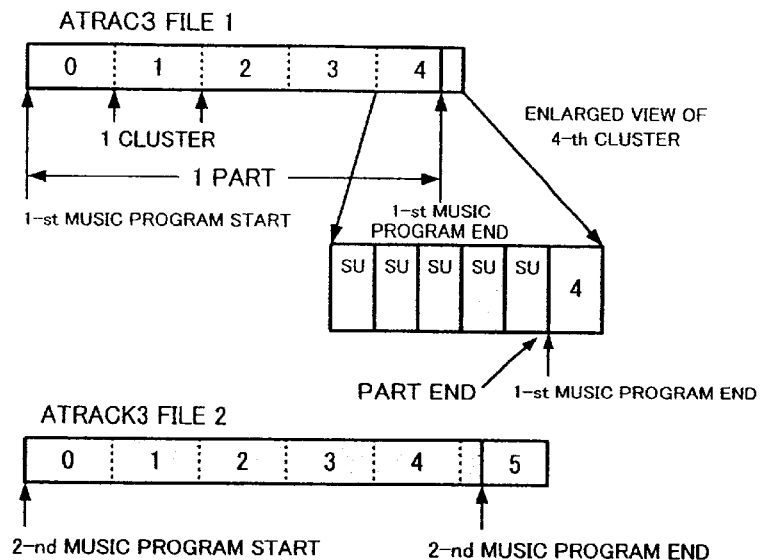
FIG. 10A is a schematic diagram showing the file structure before two files are edited with a combining process.

FIG. 10A is a schematic diagram showing the file structure in the case that two music programs of a CD or the like are successively recorded. The first program (file 1) is composed of for example five clusters. Since one cluster cannot contain two files of the first program and the second program, the file 2 starts from the beginning of the next cluster. Thus, the end of the part 1 corresponding to the file 1 is in the middle of one cluster and the remaining area of the cluster contains no data. Likewise, the second music program (file 2) is composed of one part. In the case of the file 1, the part size is 5. The first cluster starts at 0-th SU. The last cluster ends at 4-th SU.

There are four types of edit processes that are a divide process, a combine process, an erase process, and a move process. The divide process is performed to divide one track into two portions. When the divide process is performed, the number of total tracks increases by one. In the divide process, one file is divided into two files on the file system. Thus, in this case, the reproduction management file and the FAT are updated. The combine process is performed to combine two tracks into one track. When the combine process is performed, the number of total tracks decreases by one. In the combine process, two files are combined into one file on the file system. Thus, when the combine process is performed, the reproduction management file and the FAT are updated. The erase process is performed to erase a track. The track numbers after the track that has been erased decrease one by one. The move process is performed to change the track sequence. Thus, when the erase process or the move process is performed, the reproduction management file and the FAT are updated.

Figure 10B:
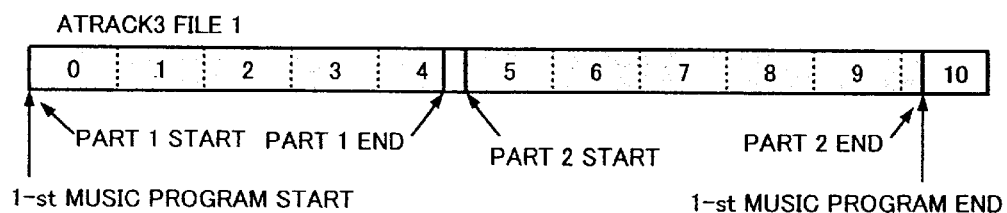
FIG. 10B is a schematic diagram showing the file structure after two files are edited with a combining process.
Figure 10C:
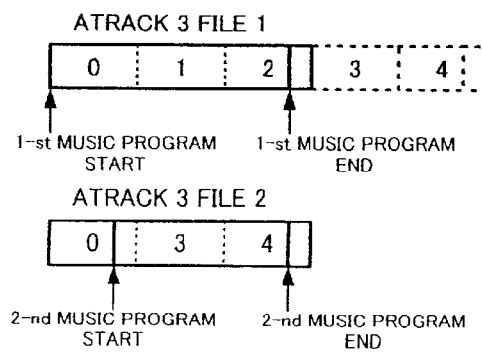
FIG. 10C is a schematic diagram showing the file structure after one file is edited with a dividing process.

FIG. 10B is a schematic diagram showing the combined result of two programs (file 1 and file 2) shown in FIG. 10A. As a result of the combine process, the combined file is composed of two parts. FIG. 10C is a schematic diagram showing the divided result of which one program (file 1) is divided in the middle of the cluster 2. By the divide process, the file 1 is composed of clusters 0, 1, and the beginning portion of cluster 2. The file 2 is composed of the end portion of cluster 2 and clusters 3 and 4.

As described above, according to the embodiment of the present invention, since the part notation is defined, as the combined result (see FIG. 10B), the start position of the part 1, the end position of the part 1, and the end portion of the part 2 can be defined with SU. Thus, to pack the space due to the combined result, it is not necessary to move the music data of the part 2. In addition, as the divided result (see FIG. 10C), it is not necessary to move data and pack the space at the beginning of the file 2.

FIG. 11 is a schematic diagram showing the detailed data structure of the reproduction management file PBLIST. FIGS. 12A and 12B show a header portion and the remaining portion of the reproduction management file PBLIST. The size of the reproduction management file is one cluster (one block=16 KB). The size of the header shown in FIG. 12A is 32 bytes. The rest of the reproduction management file PBLIST shown in FIG. 12B contains a name NM1-S area (256 bytes) (for the memory card), a name NM2-S area (512 bytes), a contents key area, a MAC area, an S-YMDhms area, a reproduction sequence management table TRKTBL area (800 bytes), a memory card additional information INF-S area (14720 bytes), and a header information redundant area. The start positions of these areas are defined in the reproduction management file.

The first 32 bytes of (0x0000) to (0x0010) shown in FIG. 12A are used for the header. In the file, 16-byte areas are referred to as slots. Referring to FIG. 12A, the header are placed in the first and second slots. The header contains the following areas. An area denoted by "Reserved" is an undefined area. Normally, in a reserved area, a null (0x00) is written. However, even if any data is written to a reserved area, the data written in the reserved is ignored. In a future version, some reserved areas may be used. In addition, data is prohibited from being written to a reserved area. When an option area is not used, it is treated as a reserved area.

=BLKID-TL0 (4 bytes)
Meaning: BLOCKID FILE ID
Function: Identifies the top of the reproduction management file.
Value: Fixed value="TL=0" (for example, 0x544C2D30)
=MCode (2 bytes)
Meaning: MAKER CODE
Function: Identifies the maker and model of the recorder/player
Value: High-order 10 bits (Maker code); low-order 6 bits (model code).
=REVISION (4 bytes)
Meaning: Number of rewrite times of PBLIST
Function: Increments whenever the reproduction management file is rewritten.
Value: Starts at 0 and increments by 1.
=S-YMDhms (4 bytes) (Option)
Meaning: Year, month, day, hour, minute, and second recorded by the recorder/player with a reliable clock.
Function: Identifies the last recorded date and time.
Value: bits 25 to 31: Year 0 to 99 (1980 to 2079)
   bits 21 to 24: Month 0 to 12
   bits 16 to 20: Day 0 to 31
   bits 11 to 15: Hour 0 to 23
   bits 05 to 10: Minute 0 to 59
   bits 00 to 04: Second 0 to 29 (two bit interval)
SY1C+L (2 bytes)
Meaning: Attribute of name (one byte code) of memory card written in NM1-S area.
Function: Represents the character code and the language code as one byte code.
Value: Character code (C): High-order one byte
   00: Non-character code, binary number
   01: ASCII (American Standard Code for Information Interchange)
   02: ASCII+KANA
   03: Modified 8859-1
   81: MS-JIS
   82: KS C 5601-1989
   83: GB (Great Britain) 2312-80
   90: S-JIS (Japanese Industrial Standards) (for Voice)
Language code (L): Low-order one byte Identifies the language based on EBU Tech 3258 standard.
   00: Not set
   08: German
   09: English
   0A: Spanish
   0F: French
   15: Italian
   1D: Dutch
   65: Korean
   69: Japanese
   75: Chinese
   When data is not recorded, this area is all 0.
SN2C+L (2 bytes)
Meaning: Attribute of name of memory card in NM2-S area.
Function: Represents the character code and the language coded as one byte code.
Value: Same as SN1C+L
=SINFSIZE (2 bytes)
Meaning: Total size of additional information of memory card in INF-S area.
Function: Represents the data size as an increment of 16 bytes. When data is not recorded, this area is all 0.
Value: Size: 0x0001 to 0x39C (924)
=T-TRK (2 bytes)
Meaning: TOTAL TRACK NUMBER
Function: Represents the number of total tracks.
Value: 1 to 0x0190 (Max. 400 tracks)
   When data is recorded, this area is all 0.
=VerNo (2 bytes)
Meaning: Format version number
Function: Represents the major version number (high order one byte) and the minor version number (low order one byte).
Value: 0x0100 (Ver 1.0)
   0x0203 (Ver 2.3)

Next, areas (see FIG. 13B) that preceded by the header will be described.
=NM1-S
Meaning: Name of memory card (as one byte code)
Function: Represents the name of the memory card as one byte code (max. 256). At the end of this area, an end code (0x00) is written. The size is calculated from the end code. When data is not recorded, null (0x00) is recorded from the beginning (0x0020) of this area for at least one byte.

Value: Various character code

=NM2-S

Meaning: Name of memory card (as two byte code)

Function: Represents the name of the memory card as two byte code (max. 512). At the end of this area, an end code (0x00) is written. The size is calculated from the end code. When data is not recorded, null (0x00) is recorded from the beginning (0x0120) of this area for at least two bytes.

Value: Various character code

=CONTENTS KEY

Meaning: Value for music program. Protected with MG(M) and stored. Same as CONTENTS KEY.

Function: Used as a key necessary for calculating MAC of S-YMDhms.

Value: 0 to 0xFFFFFFFFFFFFFFFF

=MAC

Meaning: Forged copyright information check value

Function: Represents the value generated with S-YMDhms and CONTENTS KEY.

Value: 0 to 0xFFFFFFFFFFFFFFFF

=TRK-nnn

Meaning: SQN (sequence) number of ATRAC3 data file reproduced.

Function: Represents FNo of TRKINF.

Value: 1 to 400 (0x190)

When there is no track, this area is all 0.

=INF-S

Meaning: Additional information of memory card (for example, information with respect to photos, songs, guides, etc.)

Function: Represents variable length additional information with a header. A plurality of types of additional information may be used. Each of the types of additional information has an ID and a data size. Each additional information area including a header is composed of at least 16 bytes and a multiple of 4 bytes. For details, see the following section.

Value: Refer to the section of "Data Structure of Additional Information".

=S-YMDhms (4 bytes) (Option)

Meaning: Year, month, day, hour, minute, and second recorded by the recorder/player with a reliable clock.

Function: Identifies the last recorded date and time. In this case of EMD, this area is mandatory.

Value: bits 25 to 31: Year 0 to 99 (1980 to 2079)

bits 21 to 24: Month 0 to 12 bits 16 to 24: Day 0 to 31 bits 11 to 15: Hour 0 to 23 bits 05 to 10: Minute 0 to 59 bits 00 to 04: Second 0 to 29 (two second interval)

As the last slot of the reproduction management file, the same BLKID-TL0, MCode, and REVISION as those in the header are written.

While data is being recorded to a memory card, it may be mistakenly or accidentally detached or the power of the recorder/player may be turned off. When such an improper operation is performed, a defect should be detected. As described above, the REVISION area is placed at the beginning and end of each block. Whenever data is rewritten, the value of the REVISION area is incremented. If a defect termination takes place in the middle of a block, the value of the REVISION area at the beginning of the block does not match the value of the REVISION area at the end of the block. Thus, such a defect termination can be detected. Since there are two REVISION areas, the abnormal termination can be detected with a high probability. When an abnormal termination is detected, an alarm such as an error message is generated.

In addition, since the fixed value BLKID-TL0 is written at the beginning of one block (16 KB), when the FAT is destroyed, the fixed value is used as a reference for recovering data. In other words, with reference to the fixed value, the type of the file can be determined. Since the fixed value BLKID-TL0 is redundantly written at the header and the end portion of each block, the reliability can be secured. Alternatively, the same reproduction management file can be redundantly recorded.

The data amount of an ATRAC3 data file is much larger than that of the track information management file. In addition, as will be described later, a block number BLOCK SERIAL is added to ATRAC3 data file. However, since a plurality of ATRAC3 files are recorded to the memory card, to prevent them from become redundant, both CONNUMO and BLOCK SERIAL are used. Otherwise, when the FAT is destroyed, it will be difficult to recover the file. In other words, one ATRAC3 data file may be composed of a plurality of blocks that are dispersed. To identify blocks of the same file, CONNUMO is used. In addition, to identify the order of blocks in the ATRAC3 data file, BLOCK SERIAL is used.

Likewise, the maker code (Mcode) is redundantly recorded at the beginning and the end of each block so as to identify the maker and the model in such a case that a file has been improperly recorded in the state that the FAT has not been destroyed.

FIG. 12C is a schematic diagram showing the structure of the additional information data. The additional information is composed of the following header and variable length data. The header has the following areas.

=INF

Meaning: FIELD ID

Function: Represents the beginning of the additional information (fixed value).

Value: 0x69

=ID

Meaning: Additional information key code

Function: Represents the category of the additional information.

Value: 0 to 0xFF

=SIZE

Meaning: Size of individual additional information

Function: Represents the size of each type of additional information. Although the data size is not limited, it should be at least 16 bytes and a multiple of 4 bytes. The rest of the data should be filled with null (0x00).

Value: 16 to 14784 (0x39C0)

=MCode

Meaning: MAKER CODE

Function: Identifies the maker and model of the recorder/player.

Value: High-order 10 bits (maker code), low-order 10 bits (machine code).

=C+L

Meaning: Attribute of characters in data area starting from byte 12.

Function: Represents the character code and the language code as one byte code.

Value: Same as SNC+L

=DATA

Meaning: Individual additional information

Function: Represents each type of additional information with variable length data. Real data always starts from byte 12. The length (size) of the real data should be at least 4 bytes and a multiple of 4 bytes. The rest of the data area should be filled with null (0x00).

Value: Individually defined corresponding to the contents of each type of additional information.

FIG. 13 is a table that correlates key code values (0 to 63 of additional information and types thereof. Key code values (0 to 31) are assigned to music character information. Key code values (32 to 63) are assigned to URLs (Uniform Resource Locator) (web information). The music character information and URL information contain character information of the album title, the artist name, the CM, and so forth as additional information.

FIG. 14 is a table that correlates key code values (64 to 127) of additional information and types thereof. Key code values (64 to 95) are assigned to paths/others. Key code values (96 to 127) are assigned to control/numeric data. For example, ID=98 represents TOC-ID as additional information. TOC-ID represents the first music program number, the last music program number, the current program number, the total performance duration, and the current music program duration corresponding to the TOC information of a CD (Compact Disc).

FIG. 15 is a table that correlates key code values (128 to 159) of additional information and types thereof. Key code values (128 to 159) are assigned to synchronous reproduction information. In FIG. 15, EMD stands for electronic music distribution.

Figure 16A:
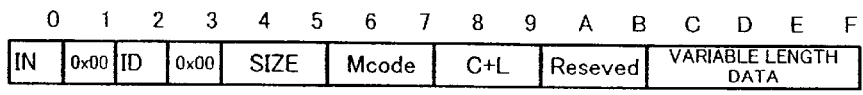
FIG. 16A is a schematic diagram showing the data structure of additional information data.
Figure 16B:
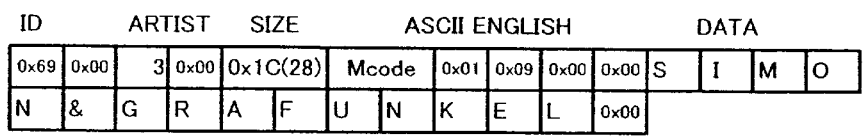
FIG. 16B is a schematic diagram showing the data structure in the case that additional information data is an artist name.

Next, with reference to FIGS. 16A to 16E, real examples of additional information will be described. As with FIG. 12C, FIG. 16A shows the data structure of the additional information. In FIG. 16B, key code ID=3 (artist name as additional information). SIZE=0x1C (28 bytes) representing that the data length of additional information including the header is 28 bytes; C+L representing that character code C=0x01 (ASCII) and language code L=0x09 (English). Variable length data after byte 12 represents one byte data "SIMON & GRAFUNKEL" as artist name. Since the data length of the additional information should be a multiple of 4 bytes, the rest is filled with (0x00).

Figure 16C:
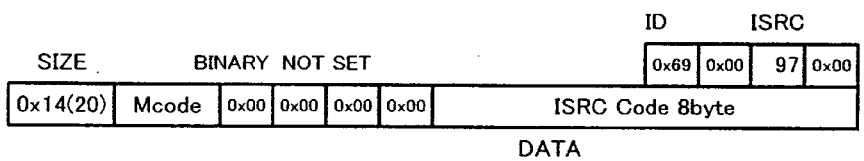
FIG. 16C is a schematic diagram showing the data structure in the case that additional information data is a copyright code.

In FIG. 16C, key code ID=97 representing that ISRC (International Standard Recording Code: Copyright code) as additional information. SIZE=0x14 (20 bytes) representing that the data length of the additional information is 20 bytes. C=0x00 and L=0x00 representing that characters and language have not been set. Thus, the data is binary code. The variable length data is eight-byte ISRC code representing copyright information (nation, copyright owner, recorded year, and serial number).

Figure 16D:
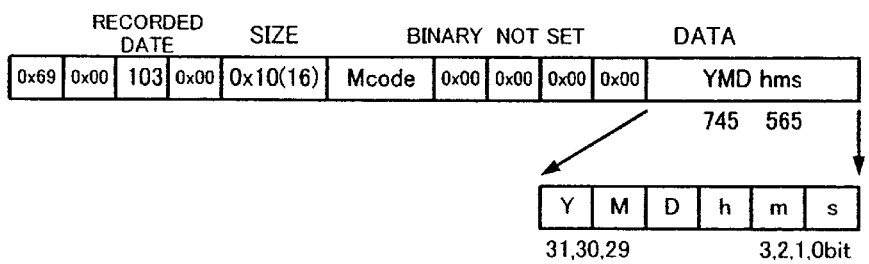
FIG. 16D is a schematic diagram showing the data structure in the case that additional information data is date/time information.

In FIG. 16D, key code ID=is 97 representing recorded date and time as additional information. SIZE=0 x 10 (16 bytes) representing that the data length of the additional information is 16 bytes. C=0x00 and L=representing that characters and language have not been set. The variable length data is four-byte code (32 bit) representing the recorded date and time (year, month, day, hour, minute, second).

Figure 16E:
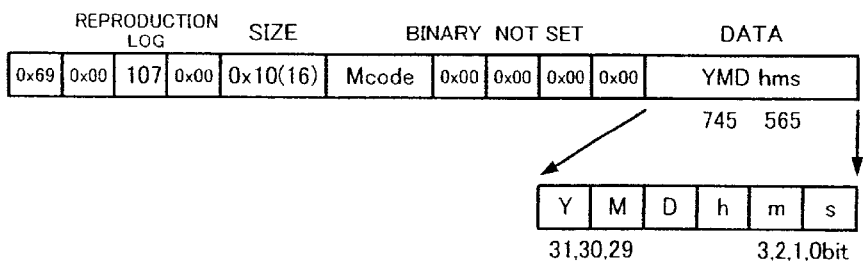
FIG. 16E is a schematic diagram showing the data structure in the case that additional information data is a reproduction log.

In FIG. 16E, key code ID=107 representing a reproduction log as additional information. SIZE=0x10 (16 bytes) representing that the data length of the additional information is 16 bytes. C=0x00 and L=0x00 representing that characters and language have not been set. The variable length data is a four-byte code representing a reproduction log (year, month, day, hour, minute, second). When the recorder/player has a reproduction log function, it records data of 16 bytes whenever it reproduces music data.

FIG. 17 is a schematic diagram showing a data arrangement of ATRAC3 data file A3Dnnnn in the case that 1 SU is N bytes (for example, N=384 bytes). FIG. 17 shows an attribute header (1 block) of a data file and a music data file (1 block). FIG. 17 shows the first byte (0x0000 to 0x7FF0) of each slot of the two blocks (16×2=32 kbytes). As shown in FIG. 18, the first 32 bytes of the attribute header are used as a header; 256 bytes are used as a music program area NM1 (256 bytes); and 512 bytes are used as a music program title area NM2 (512 bytes). The header of the attribute header contains the following areas.

BLKID-HD0 (4 bytes)

Meaning: BLOCKID FIELD ID

Function: Identifies the top of an ATRA3 data file.

Value: Fixed value="HD=0" (For example, 0x48442D30)

=MCode (2 bytes)

Meaning: MAKER CODE

Function: Identifies the maker and model of the recorder/player

Value: High-order 10 bits (maker code); low-order 6 bits (machine code)

=BLOCK SERIAL (4 bytes)

Meaning: Track serial number

Function: Starets from 0 and increments by 1. Even if a music program is edited, this value does not vary.

Value: 0 to 0xFFFFFFFF.

=N1C+L (2 bytes)

Meaning: Represents the attribute of data (NM1) of a track (music program title).

Function: Represent the character code and language code of NM1 as one byte code.

Value: Same as SN1C+L

=N2C+L (2 bytes)

Meaning: Represents the attribute of data (NM2) of a track (music program title).

Function: Represent the character code and language code of NM1 as one byte code.

Value: Same as SN1C+L

=INFSIZE (2 bytes)

Meaning: Total size of additional information of current track.

Function: Represents the data size as a multiple of 16 bytes. When data is not recorded, this area should be all 0.

Value: 0x0000 to 0x3C6 (966)

=T-PRT (2 bytes)

Meaning: Number of total bytes

Function: Represents the number of parts that composes the current track. Normally, the value of T-PRT is 1.

Value: 1 to 285 (645 dec).

=T-SU (4 bytes)

Meaning: Number of total SU.

Function: Represents the total number of SU in one track that is equivalent to the program performance duration.

Value: 0x01 to 0x001FFFFF

=INX (2 bytes) (Option)

Meaning: Relative position of INDEX

Function: Used as a pointer that represents the top of a representative portion of a music program. The value of INX is designated with a value of which the number of SU is divided by 4 as the current position of the program. This value of INX is equivalent to 4 times larger than the number of SU (around 93 msec).

Value: 0 to 0xFFFF (max, around 6084 sec)

=XT (2 bytes) (Option)

Meaning: Reproduction duration of INDEX

Function: Designates the reproduction duration designated by INX-nnn with a value of which the number of SU is divided by 4. The value of INDEX is equivalent to four times larger than the normal SU (around 93 msec).

Value: 0x0000 (no setting); 0x01 to 0xFFFE (up to 6084 sec); 0XFFFF (up to end of music program) Next, the music program title areas NM1 and NM2 will be described.

=NM1

Means: Character string of music program title

Function: Represents a music program title as one byte code (up to 256 characters) (variable length). The title area should be completed with an end code (0x00). The size should be calculated from the end code. When data is not recorded, null (0x00) should be recorded from the beginning (0x0020) of the area for at least one byte.

Value: Various character codes

=NM2

Means: Character string of music program title

Function: Represents a music program title as two byte code (up to 512 characters) (variable length). The title area should be completed with an end code (0x00). The size should be calculated from the end code. When data is not recorded, null (0x100) should be recorded from the beginning (0x0120) of the area for at least two bytes.

Value: Various character codes

Data of 80 bytes starting from the fixed position (0x320) of the attribute header is referred to as track information area TRKINF. This area is mainly used to totally manage the security information and copy control information. FIG. 19 shows a part of TRKINF. The area TRKINF contains the following areas.

=CONTENTS KEY (8 bytes)

Meaning: Value for each music program. The value of CONTENTS KEY is protected in the security block of the memory card and then stored.

Function: Used as a key for reproducing a music program. It is used to calculate the value of MAC.

Value: 0 to 0xFFFFFFFFFFFFFFFF

=MAC (8 bytes)

Meaning: Forged copyright information check value

Function: Represents the value generated with a plurality of values of TRKINF including contents cumulation numbers and a secret sequence number.

The secret sequence number is a sequence number recorded in the secret area of the memory card. A non-copyright protection type recorder cannot read data from the secret area of the memory card. On the other hand, a copyright protection type recorder and a computer that operates with a program that can read data from a memory card can access the secret area.

=A (1 byte)

Meaning: Attribute of part.

Function: Represents the information of such as compression mode of a part.

Value: The details will be described in the following (see FIGS. 19 and 20).

Next, the value of the area A will be described. In the following description, monaural mode (N=0 or 1) is defined as a special joint mode of which bit 7=1, sub signal=0, main signal=(L+R). A non-copyright protection type player may ignore information of bits 2 and 1.

Bit 0 of the area A represents information of emphasis on/off state. Bit 1 of the area A represents information of reproduction skip or normal reproduction. Bit 2 of the area A represents information of data type such as audio data, FAX data, or the like. Bit 3 of the area A is undefined. By a combination of bits 4, 5, and 6, mode information of ATRAC3 is defined as shown in FIG. 20. In other words, N is a mode value of 3 bits. For five types of modes that are monaural (N=0 or 1), LP (N=2), SP (N=4), EX (N=5), and HQ (N=7), record duration (64 MB memory card only), data transmission rate, and the number of SU per block are listed. The number of bytes of 1 SU depends on each mode. The number of bytes of 1 SU in the monaural mode is 136 bytes. The number of bytes of 1 SU in the LP mode is 192 bytes. The number of bytes of 1 SU in the SP mode is 304 bytes. The number of bytes of 1 SU in the EX mode is 384 bytes. The number of bytes of 1 SU in the HQ mode is 512 bytes. Bit 7 of the area A represents ATRAC3 modes (0: Dual, 1: JOint)

For example, an example of which a 64 MB memory card is used in the SP mode will be described. A 64-MB memory card has 3968 blocks. In the SP mode, since 1 SU is 304 bytes, one block has 53 SU. 1 SU is equivalent to $(1024/44100)$ seconds. Thus, one block is $(1024/44100) \times 53 \times (3968-10) = 4863$ seconds=81 minutes. The transmission rate is $(44100/1024) \times 304 \times 8 = 104737$ bps.

=LT (one byte)

Meaning: Reproduction restriction flag (bits 7 and 6) and security partition (bits 5 to 0).

Function: Represents a restriction of the current track.

Value: bit 7: 0=no restriction, 1=restriction bit 6: 0=not expired, 1=expired bits 5 to 0: security partition (reproduction prohibited other than 0)

=FNo (2 bytes)

Meaning: File number.

Function: Represents the initially recorded track number that designates the position of the MAC calculation value recorded in the secret area of the memory card.

Value: 1 to 0x190 (400)

=MG(D) SERIAL-nnn (16 bytes)

Meaning: Represents the serial number of the security block (security IC 20) of the recorder/player.

Function: Unique value for each recorder/player

Value: 0 to 0xFFFFFFFFFFFFFFFFFFFFFFFFFFFFFFFF

=CONNUM (4 bytes)

Meaning: Contents cumulation number

Function: Represents a unique value cumulated for each music program. The value is managed by the security block of the recorder/player. The upper limit of the value is $2^{32}$ that is 4,200,000,000. Used to identify a recorded program.

Value: 0 to 0xFFFFFFFF

YMDhms-S (4 bytes) (Option)

Meaning: Reproduction start date and time of track with reproduction restriction Function: Represents the date and time at which data reproduction is permitted with EMD.

Value: Same as the notation of date and time of other areas

=YMDhms-E (4 bytes) (Option)

Meaning: Reproduction end date and time of track with reproduction restriction

Function: Represents the date and time at which data reproduction is expired with EMD.

Value: Same as the notation of date and time of other areas

=MT (1 byte) (Option)

Meaning: Maximum value of number of permitted reproduction times

Function: Represents the maximum number of reproduction times designated by EMD.

Value: 1 to 0xFF. When not used, the value of the area MT is 00.

=CT (1 byte) (Option)

Meaning: Number of reproduction times

Function: Represents the number of reproduction times in the number of permitted reproduction times. Whenever data is reproduced, the value of the area CT is decremented.

Value: 0x00 to 0xFF. When not used, the value of the area CT is 0x00. When bit 7 of the area LT is 1 and the value of the area CT is 00, data is prohibited from being reproduced.

=CC (1 byte)

Meaning: COPY CONTROL

Function: Controls the copy operation.

Value: bits 6 and 7 represent copy control information. bits 4 and 5 represent copy control information of a high speed digital copy operation. bits 2 and 3 represent a security block authentication level. bits 0 and 1 are undefined.

Example of CC:

(bits 7 and 6)

11: Unlimited copy operation permitted

01: copy prohibited

00: one time copy operation permitted (bits 3 and 2)

00: analog/digital input recording

MG authentication level is 0.

When digital record operation using data from a CD is performed, (bits 7 and 6): 00 and (bits 3 and 2): 00.

=CN (1 byte) (Option)

Meaning: Number of permitted copy times in high speed serial copy management system Function: Extends the copy permission with the number of copy times, not limited to one time copy permission and copy free permission. Valid only in first copy generation. The value of the area CN is decremented whenever the copy operation is performed.

Value"

00: Copy prohibited 01 to 0xFE: Number of times

0xFF: Unlimited copy times

The track information area TRKINF is followed by a 24-byte part management information area (PRTINF) starting from 0x0370. When one track is composed of a plurality of parts, the values of areas PRTINF of the individual parts are successively arranged on the time axis. FIG. 22 shows a part of the area PRTINF. Next, areas in the area PRTINF will be described in the order of the arrangement.

=PRTSIZE (4 bytes)

Meaning: Part size

Function: Represents the size of a part. Cluster: 2 bytes (highest position), start SU: 1 byte (upper), end SU: 1 byte (lowest position).

Value: cluster: 1 to 0x1F40 (8000) start SU: 0 to 0xA0 (160) end SU: 0 to 0xA0 (16) (Note that SU starts from 0.)

=PRTKEY (8 bytes)

Meaning: Part encrypting value

Function: Encrypts a part. Initial value=0. Note that edit rules should be applied.

Value: 0 to 0xFFFFFFFFFFFFFFFF

=CONNUMO (4 bytes)

Meaning: Initially generated contents cumulation number key

Function: Uniquely designates an ID of contents.

Value: Same value as the value of the contents cumulation number initial value key As shown in FIG. 17, the attribute header of an ATRAC3 data file contains additional information INF. The additional information is the same as the additional information INF-S (see FIGS. 11 and 12B) of the reproduction management file except that the start position is not fixed. The last byte position (a multiple of four bytes) at the end of one or a plurality of parts is followed by data of the additional information INF.

=INF

Meaning: Additional information with respect to track

Function: Represents variable length additional information with a header. A plurality of different types of additional information may be arranged. Each of additional information areas has an ID and a data size. Each additional information area is composed of at least 16 bytes and a multiple of 4 bytes.

Value: Same as additional information INF-S of reproduction management file

The above-described attribute header is followed by data of each block of an ATRAC3 data file. As shown in FIG. 23, a header is added for each block. Next, data of each block will be described.

BLKID-A3D (4 bytes)

Meaning: BLOCKID FILE ID

Function: Identifies the top of ATRAC3 data.

Value: Fixed value="A3D" (for example, 0x41334420)

=MCode (2 bytes)

Meaning: MAKER CODE

Function: Identifies the maker and model of the recorder/player

Value: High-order 10 bits (maker code); low-order 6 bits (model code)

=CONNUMO (4 bytes)

Meaning: Cumulated number of initially created contents

Function: Designates a unique ID for contents. Even if the contents are edited, the value of the area CONNUMO is not changed.

Value: Same as the contents cumulation number initial key

=BLOCK SERIAL (4 bytes)

Meaning: Serial number assigned to each track

Function: Starts from 0 and increments by 1. Even if the contents are edited, the value of the area BLOCK SERIAL is not changed.

Value: 0 to 0xFFFFFFFE
=BLOCK-SEED (8 bytes)
Meaning: Key for encrypting one block Function: The beginning of the block is a random number generated by the security block of the recorder/player. The random number is followed by a value incremented by 1. When the value of the area BLOCK-SEED is lost, since sound is not generated for around one second equivalent to one block, the same data is written to the header and the end of the block. Even if the contents are edited, the value of the area BLOCK-SEED is not changed.

Value: Initially 8-bit random number
=INITIALIZATION VECTOR (8 bytes)
Meaning: Value necessary for encrypting/decrypting ATRAC3 data
Function: Represents an initial value necessary for encrypting and decrypting ATRAC3 data for each block. A block starts from 0. The next block starts from the last encrypted 8-bit value at the last SU. When a block is divided, the last eight bytes just before the start SU is used. Even if the contents are edited, the value of the area INITIALIZATION VECTOR is not changed.

Value: 0 to 0xFFFFFFFFFFFFFFFF
=SU-nnn
Meaning: Data of sound unit
Function: Represents data compressed from 1024 samples. The number of bytes of output data depends on the compression mode. Even if the contents are edited, the value of the area SU-nnn is not changed. For example, in the SP mode, N=384 bytes.

Value: Data value of ATRAC3

In FIG. 17, since N=384, 42 SU are written to one block. The first two slots (4 bytes) of one block are used as a header. In the last slot (two bytes), the areas BLKID-A3D, MCode, CONNUMO, and BLOCK SERIAL are redundantly written. Thus, M bytes of the remaining area of one block is (16,384−384×42−16×3=208) bytes. As described above, the eight-byte area BLOCK SEED is redundantly recorded.

Figure 24:
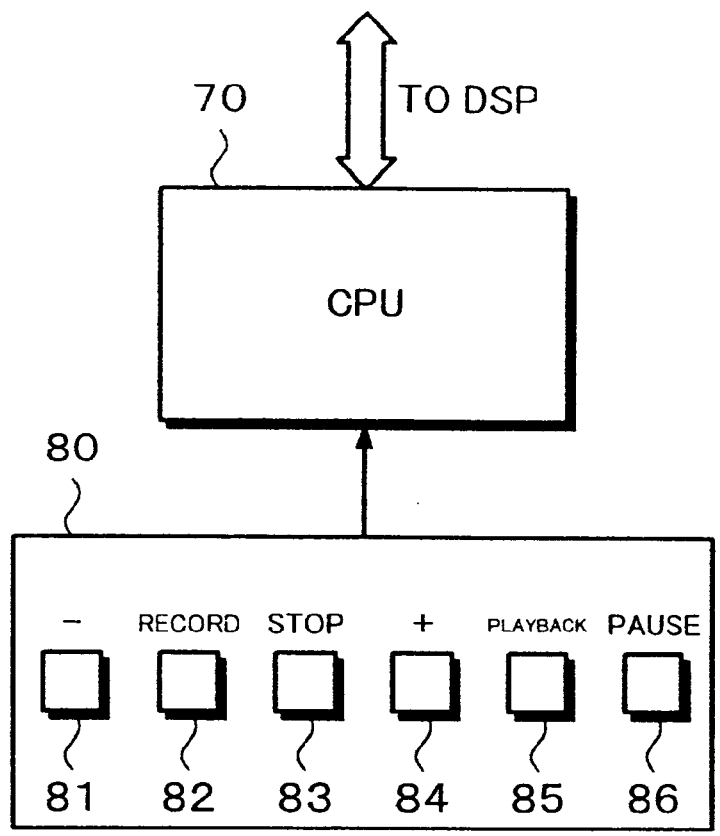
FIG. 24 is a schematic diagram showing a peripheral portion of the operation portion according a first embodiment of the present invention.

Next, with reference to the accompanying drawings, a digital audio recorder according a first embodiment of the present invention will be described. FIG. 24 shows the structure of principal portions of the first embodiment of the present invention. In FIG. 24, reference numeral 70 is a CPU disposed in the audio system. The CPU 70 is connected to the above-described DSP 30 through a bus interface and a bus. An operation portion 80 is connected to the CPU 70.

As shown in FIG. 24, the operation portion 80 has buttons 81 to 86. In reality, the button 81 is a record/playback position backward button. The button 84 is a record/playback position forward button. The button 82 is a record button. The button 85 is a playback button. The button 83 is a stop button. The button 86 is a pause button.

When one of the buttons 81 to 86 is pressed, the operation portion 80 generates detection information at the timing of which the button was pressed and corresponding thereto. The detection information is supplied to the CPU 70. The CPU 70 monitors the operation state of the operation portion 80 corresponding to the detection information received therefrom. When the CPU 70 has determined that a predetermined operation had been performed with a predetermined button, the CPU 70 generates control information corresponding to the button and supplies the control information to the individual portions of the apparatus. Thus, the apparatus operates corresponding to the control information.

When the record button 82 is pressed, the record operation is started. In other words, audio data that is generated by a selected input source is successively written to a predetermined area of the memory card 40. When the playback button 85 is pressed, the reproducing operation is started. In other words, audio data that is written in a predetermined area of the memory card 40 is successively read. Corresponding to the audio data that is read from the memory card 40, an analog signal is generated and obtained from the line output terminal 19.

In the reproduction mode, when the user continuously presses the playback button 85 for a predetermined time period, in parallel with the reproducing operation, an index management information wring process is performed. In the index management information writing process, the user can designate any reproduction region. In reality, in the index management information wiring process, information that represents the start position of index information defined at the timing of which the playback button 85 was pressed and information that represents the time period for which the playback button 85 was pressed are generated by the CPU 70. These two types of information are written as information that represents a reproduction region to a predetermined area of the memory card 40.

In other words, the user designates his or her favorite feature portion of a music program or the like that is being reproduced or a digest portion thereof. Information that represents the reproduction region is written to a predetermined region of the memory card 40. The information that represents the start position of the index information defined at the timing of which the playback button was pressed is stored to the INX of the attribute header of the above-described ATRAC3 audio file A3DDnnnn. The information that represents the time period for which the playback button 85 was continuously pressed is stored to the XT. With the INX, around up to 6084 seconds can be designated. With the XT, around up to 6084 seconds can be designated.

Once a user's favorite feature portion or a digest portion is designated and information that represents the reproduction region is written to a predetermined area of the memory card 40, before the reproducing operation is performed next time, the user can easily search a desired music program. In addition, only feature portions can be successively reproduced.

Figure 26:
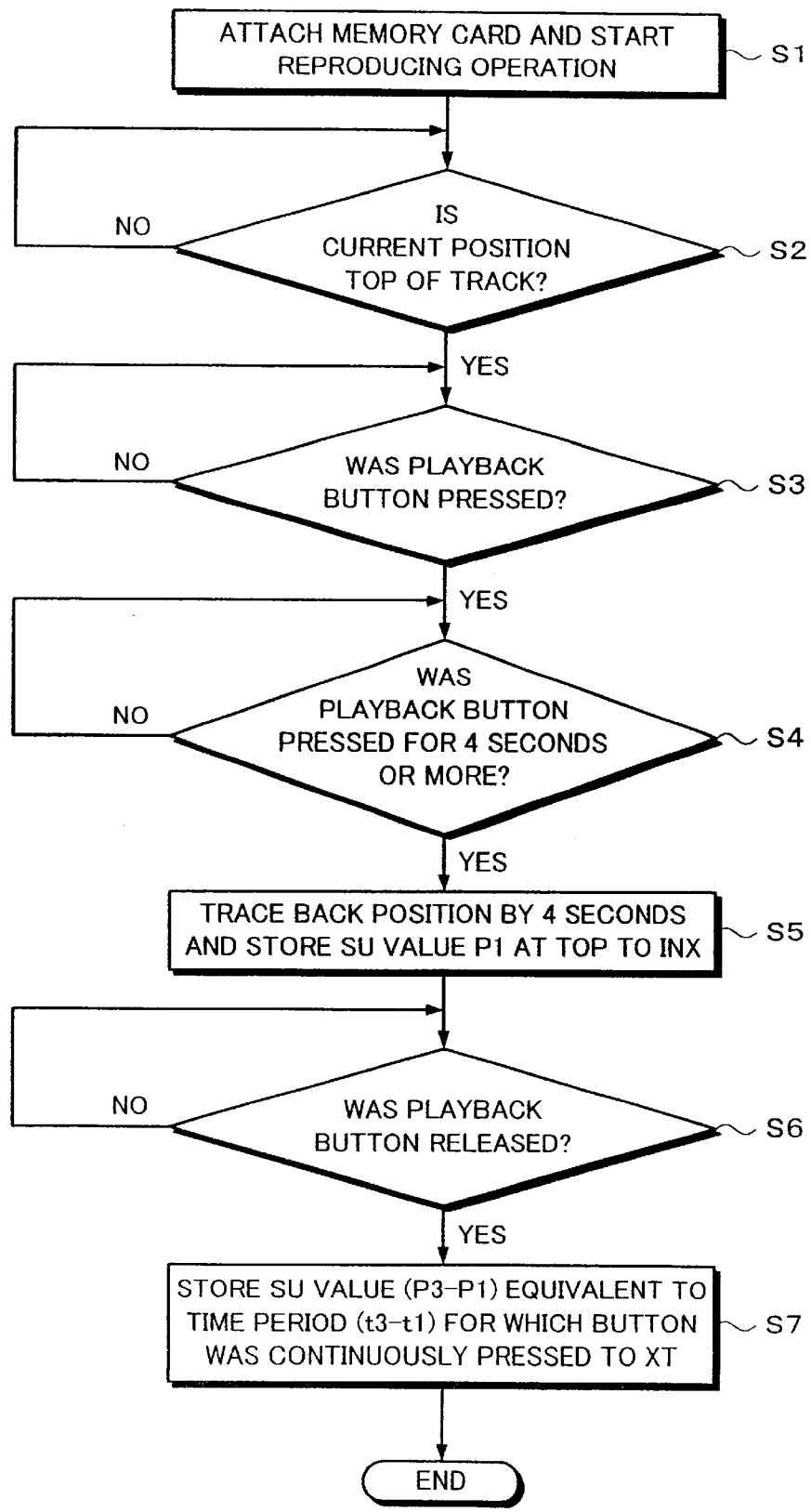
FIG. 26 is a flow chart showing a process for designating a digest portion according to the embodiment of the present invention.
Figure 27:
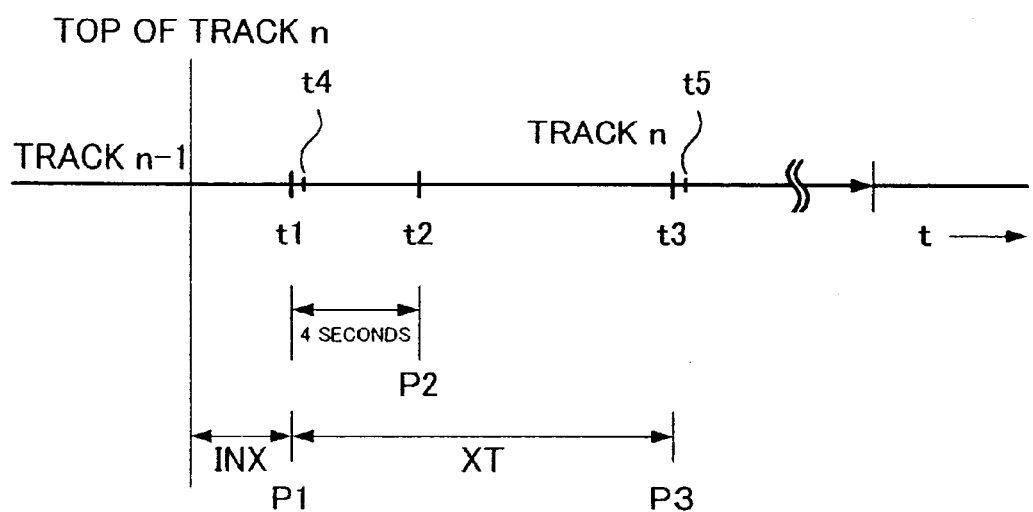
FIG. 27 is a timing chart showing the digest portion designating process according to the present invention.

Next, with reference to FIGS. 26 and 27, the first embodiment according to the present invention will be described in detail. In the above-described data format, as the values of the INX and the XT, the number of SUs that is decreased by 4 is used. However, in the following description, for simplicity, an example of which the number of SUs is not decreased by 4 will be described. First of all, the memory card is attached to the recorder. Thereafter, the playback button 85 is pressed. Thus, the reproducing operation is started (at step S1). Thereafter, the flow advances to step S2. At step S2, it is determined whether or not the current position is the top of a track. When the determined result at step S2 is Yes (namely, the current position is the top of a track), the number of SUs is counted. Thereafter, the flow advances to step s3.

At step S3, it is determined whether or not the playback button 85 was pressed. When the determined result at step S3 is Yes (namely, the playback button 85 was pressed), the flow advances to step S4. At step S4, it is determined whether or not the playback button 85 was continuously pressed for 4 seconds or more. When the determined result at step S4 is Yes (namely, the playback button 85 was continuously pressed for 4 seconds or more), the flow advances to step S5. At step S5, in parallel with the reproducing operation, the index management information writing process is performed. In the index management information writing process, the count value of the number of SUs from the top of the track to the timing at which the playback button 85 was pressed is written to the INX. In reality, as shown in FIG. 27, the playback button 85 is pressed at timing t1. When the playback button 85 is continuously pressed for 4 seconds (at timing t2), the position is traced back from timing t2 by 4 seconds. The count value P1 of the number of SUs from the top of the track to timing t1 is written to the INX. At step S5, the start position of the index information is defined.

Thereafter, the flow advances to step S6. At step S6, it is determined whether or not the playback button 85 was released. When the determined result at step S6 is Yes (namely, the playback button 85 was released and turned off), the flow advances to step S7. At step S7, the count value of the number of SUs for which the playback button 85 was continuously pressed is written to the XT. In reality, When the playback button 85 is turned off at timing t3 as shown in FIG. 27, the count value (P3–P1) of the number of SUs corresponding to the time period (t3–t1) for which the playback button 85 was continuously pressed is written to the XT. At step S7, the length of the designated reproduction region is defined. Thereafter, the index management information writing process in parallel with the reproducing operation is completed.

In the first embodiment, an example of which when the playback button 85 is pressed for 4 seconds or more the index management information writing process is performed was described. Alternatively, a timing at which another button is turned off may be monitored. In addition, when the button is continuously pressed for a predetermined time period or more, the index management information writing process may be performed. In other words, in the monitoring process of a conventional operation portion, only the timing at which a predetermined button was pressed is used to generate various types of control information. However, according to the present invention, using the timing at which a button was turned off, it is determined whether that button was continuously pressed for 4 seconds or more. Thus, a predetermined button can be used in common with a normally designated operation and the index management information writing process. Thus, the determination time period of which the normally designated operation is distinguished from the index management information writing process is not limited to 4 seconds. Consequently, as long as the apparatus can be prevented from malfunctioning, the determination time period may be smaller than 4 seconds or more than 4 seconds.

Figure 25:
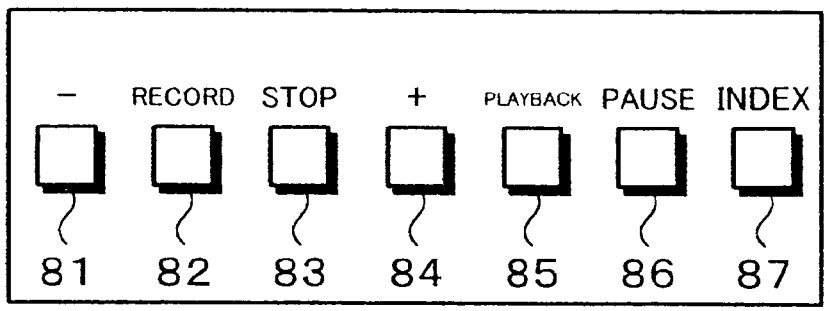
FIG. 25 is a schematic diagram showing a peripheral portion of the operation portion according a second embodiment of the present invention.

FIG. 25 shows the structure of an operation portion 80 according to a second embodiment of the present invention. In the second embodiment, the operation portion 80 has a dedicated index button 87 as well as the operation buttons 81 to 86 shown in FIG. 24. With the index button 87, the index management information is written. Detection information generated corresponding to the operation state of the operation portion 80 is supplied to the CPU 70 as with the first embodiment shown in FIG. 24.

For example, when the record button 82 is pressed, the recording operation is started. In other words, audio data generated by a selected input source is successively written to a predetermined area of the memory card 40. When the playback button 85 is pressed, the reproducing operation is started. In other words, audio data that is written to a predetermined area of the memory card 40 is successively read. An analog audio signal is generated corresponding to the audio data that is read from the memory card 40. The generated audio signal is obtained form the line output terminal 19.

In the reproduction mode, when the user continuously presses the index button 87 for a predetermined time period or more, in parallel with the reproducing operation, the index management information writing process is performed. In this state, the user can designate his or her desired reproduction region. In reality, in the index management information writing process, information that represents the start position of index information defined at the timing at which the index button 87 was pressed and information that represents the time period for which the index button 87 was continuously pressed are generated by the CPU 70. These two types of information are written as information that represents the reproduction region to a predetermined area of the memory card 40.

In other words, the user designates his or her favorite feature portion of a music program or the like that is being reproduced or a so-called digest portion thereof. The information that represents the reproduction region is written to a predetermined area of the memory card 40. The information that represents the start position of the index information defined at the timing of which the index button 87 was pressed is stored to the INX of the above-described ATAC3 data file A3D-nnn as with the first embodiment. The information that represents the time period for which the playback button 85 was continuously pressed is stored to the XT.

Once the user designates a user's favorite feature portion or a so-called digest portion and the reproduction region thereof is written to a predetermined region of the memory card 40, before the reproducing operation is performed next time, the user can easily search a desired music program. In addition, only feature portions can be successively reproduced.

Figure 28:
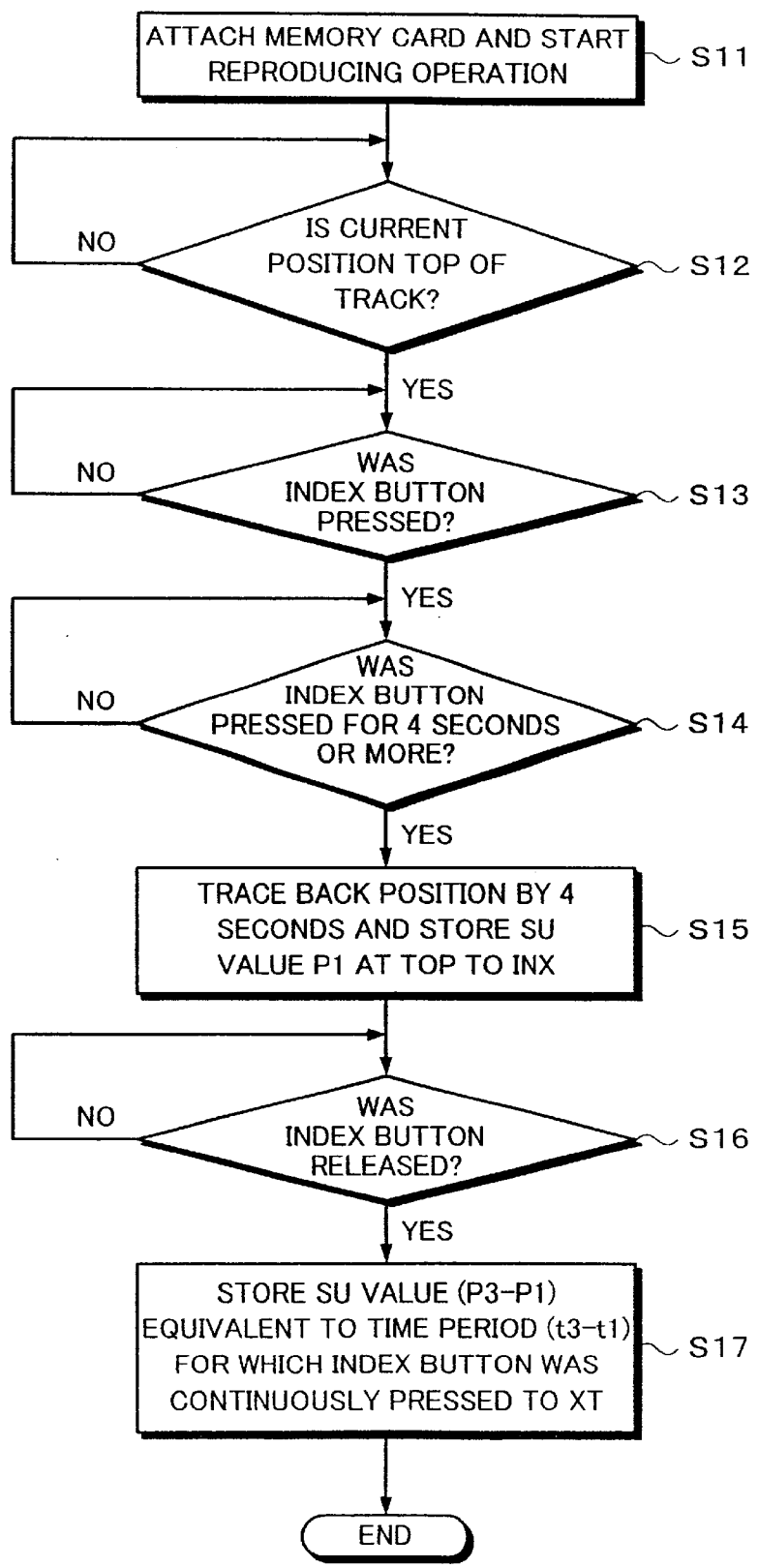
FIG. 28 is a flow chart showing a digest portion designating process according to the second embodiment of the present invention.

Next, with reference to FIGS. 27 and 28, a second embodiment of the present invention will be described in detail. First of all, the memory card is attached to the recorder. When the playback button 85 is pressed, the reproducing operation is started (at step S11). Thereafter, the flow advances to step S12. At step S12, it is determined whether or not the current position is the top of a track. When the determined result at step S11 is Yes (namely, the current position is the top of a track), the number of SUs is counted. Thereafter, the flow advances to step S13.

At step S13, it is determined whether or not the index button 87 was pressed. When the determined result at step S13 is Yes (namely, the index button 87 was pressed), the flow advances to step S14. At step S14, it is determined whether or not the index button 87 was continuously pressed for 4 seconds or more. When the determined result at step S14 is Yes (namely, the index button 87 was continuously pressed for 4 seconds or more), the flow advances to step S15. At step S15, in parallel with the reproducing operation, the index management information writing process is performed. In the index management information writing process, the count value of the number of SUs from the top of the track to the timing at which the index button 87 was pressed is written to the INX. In reality, as shown in FIG. 27, the index button 87 is pressed at timing t1. When the index button 87 is continuously pressed for 4 seconds (at timing t2), the position is traced back from timing t2 by 4 seconds. The count value P1 of the number of SUs from the top of the track to timing t1 is written to the INX. At step S15, the start position of the index information is defined.

Thereafter, the flow advances to step S16. At step S16, it is determined whether or not the index button 87 was released. When the determined result at step S16 is Yes (namely, the index button 87 was released and turned off), the flow advances to step S17. At step S17, the count value of the number of SUs corresponding to the time period for which the index button 87 was continuously pressed is written to the XT. In reality, as shown in FIG. 27, when the index button 87 is turned off at timing t3, the count value (P3−P1) of the number of SUs corresponding to the time period (t3−t1) for which the index button 87 was continuously pressed is written to the XT. At step S17, the length of the reproduction region is defined. Thereafter, the index management information writing process in parallel with the reproducing operation is completed.

In the second embodiment, when the dedicated index button 87 is continuously pressed for 4 seconds or more, the index management information writing process is performed. Alternatively, using the timing at which the index button 87 was pressed, the index management information writing operation may be performed.

FIG. 29 shows an index management information wiring process using only the timing at which the index button 87 is pressed. Next, with reference to FIGS. 27 and 29, a modification of the second embodiment will be described. First of all, the memory card is attached to the recorder. When the playback button 85 is pressed, the reproducing operation is started (at step S21). Thereafter, the flow advances to step S22. At step S22, it is determined whether or not the current position is the top of a track. When the determined result at step S22 is Yes (namely, the current position is the top of a track), the number of SUs is counted. Thereafter, the flow advances to step S23.

At step S23, it is determined whether or not the index button 87 was continuously pressed for 0.2 seconds or more. When the determined result at step S23 is Yes (namely, the index button 87 was continuously pressed for 0.2 seconds or more), the flow advances to step S24. At step S24, it is determined whether or not the index button 87 was continuously pressed for 0.2 seconds or more once again. At steps S23 and S24, the determination criterion of 0.2 seconds is made so as to determine whether or not the index button 87 was intentionally operated. Thus, at steps S23 and S24, it may be determined whether the index button 87 was simply pressed. When the determined result at step S24 is Yes (namely, the index button 87 was pressed for 0.2 seconds or more), the flow advances to step S25. At step S25, in parallel with the reproducing operation, the index management information writing process is performed. In the index management information writing process, the count value of the number of SUs from the top of the track to the timing at which the index button 87 was pressed first time is written to the INX. In reality, as shown in FIG. 27, the index button 87 is pressed at timing t1. When the index button 87 is continuously pressed for 0.2 seconds (at timing t4), the position is traced back from timing t4 by 0.2 seconds. The count value P1 of the number of SUs from the top of the track to the timing t1 is written to the INX. At step S25, the start position of the index information is defined.

Thereafter, the flow advances to step S26. At step S26, the count value of the number of SUs from the timing at which the index button 87 was pressed first time to the timing at which the index button 87 was pressed second time is written to the XT. At step S26, the length of the reproduction region is defined. In reality, as shown in FIG. 27, the index button 87 is pressed at timing t3. When the index button 87 is continuously pressed for 0.2 seconds (at timing t5), the position is traced back from timing t5 by 0.2 seconds. Thus, the timing of the end of the reproduction region is defined. The count value (P3−P1) of the number of SUs corresponding to the time period (t3−t1) from the timing at which the index button 87 was pressed first time to the timing at which the index button 87 was pressed second time is written to the XT. Thereafter, the index management information writing process in parallel with the reproducing operation is completed.

In the above-described embodiments, in the reproducing state of which the playback button was pressed, when a predetermined operation is performed with a predetermined operation member, the index management information writing process is performed. Alternatively, in the recording state of which the record button was pressed, when a predetermined operation is performed with a predetermined operating member, in parallel with the recording operation, the index management information writing process can be performed.

In addition, as shown in FIG. 20, in the LP mode, a record time period for 128 minutes can be designated. For example, music programs of three 40-minute CDs can be recorded to one memory card.

When music programs of a plurality of albums are recorded to one memory card, if representative music programs of these albums can be reproduced as digest portions, a desired music program can be easily searched.

A representative music program of an album is preferably a digest portion of a music program that is single-cut from an album.

The digest portion of the album is written at the INF-S of the address 0x0647 or later of the reproduction management file (PBLIST).

An album digest is designated with a variable length at ID=77 as shown in FIG. 14.

When digest points of a plurality of albums are designated to the reproduction management file (PBLIST), with reference to the number of total albums (the number of total sets) recorded in one memory card corresponding to ID=117 shown in FIG. 14, the number of digests is written at ID=77.

When digests (INX, XT) have been designated for all music programs of a particular album, the music program number of a representative music program of the album is written to ID=77.

When a digest portion of an album is reproduced, with reference to the INF-S at the address 0x0647 or later of the reproduction management file (PBLIST), the album number and the program number are obtained from ID=77. Thus, the representative music program is reproduced.

Alternatively, digest information (INX, XT) corresponding to the representative music program of the album may be directly written at ID=77.

In the above-described embodiments, in the index management information writing process, as information that represents the start position of index information, the count value of the number of SUs from the top of a track was used. Alternatively, information that represents another reproduction position or reproduction timing may be written to the INX. As information that represents the length of the reproduction region, the count values of the number of SUs between particular timings was used. Alternatively, information that represents another reproduction position or reproduction timing may be written to the XT. In addition, in the above-described embodiments, index management information was written to the INX and XT. Alternatively, index management information may be written to another predetermined area.

According to the present invention, when a predetermined operation is performed with a predetermined operation member, in parallel with the reproducing operation, the index management information writing process is performed. Thus, the user can designate any reproduction region. In reality, in the index management information writing process, information that represents the start position of index information defined at the timing of which the user pressed the playback button and information that presents the time period for which the user continuously pressed the playback button are generated by the controlling portion. The two types of informations are written as information that represents the reproduction region to a predetermined area of the semiconductor memory. Thus, a user's favorite feature portion of a music program that is reproduced or a so-called digest portion can be designated. As a result, according to the present invention, the user can designate index information of music programs. Thus, the user can easily search a desired music program. As well as a digest portion of audio contents, a climax of video contents may be designated.

Thus, the usability and flexibility of the recording/reproducing apparatus can be improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A non-volatile memory for recording a program composed of a plurality of blocks, wherein one of the plurality of blocks is used as an attribute information area for attribute information, wherein each of the other blocks is composed of a header portion and a main data portion, and wherein a start address and digest period information of a digest portion designated by the user is written to the attribute information area.

2. The non-volatile memory as set forth in claim 1, wherein the program recorded in the non-volatile memory is categorized as a plurality of albums, and wherein the non-volatile memory also has a reproduction management file area for recording the digest information of each of the categorized albums.

* * * * *